(12) United States Patent
Freer et al.

(10) Patent No.: US 10,520,538 B2
(45) Date of Patent: Dec. 31, 2019

(54) IDENTIFYING AND DETERMINING STATUS OF REEFER CONTAINERS

(71) Applicant: Cooper Technologies Company, Houston, TX (US)

(72) Inventors: Benjamin Avery Freer, Syracuse, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 61 days.

(21) Appl. No.: 15/645,498

(22) Filed: Jul. 10, 2017

(65) Prior Publication Data

US 2018/0011132 A1 Jan. 11, 2018

Related U.S. Application Data

(60) Provisional application No. 62/360,124, filed on Jul. 8, 2016.

(51) Int. Cl.
*G01R 31/02* (2006.01)
*F25D 29/00* (2006.01)

(52) U.S. Cl.
CPC .......... *G01R 31/02* (2013.01); *F25D 29/003* (2013.01)

(58) Field of Classification Search
CPC ....... G01R 31/02; G01R 31/04; F25D 11/003; F25D 29/003
See application file for complete search history.

(56) References Cited

U.S. PATENT DOCUMENTS

| | | | |
|---|---|---|---|
| 4,885,564 A | 12/1989 | Vercellotti et al. | |
| 5,552,701 A | 9/1996 | Veteran et al. | |
| 6,516,053 B1 | 2/2003 | Ryan et al. | |
| 7,633,185 B2 | 12/2009 | Rowell | |
| 2005/0203647 A1* | 9/2005 | Landry | H04L 12/2818 700/83 |
| 2007/0220907 A1* | 9/2007 | Ehlers | F25B 49/005 62/126 |

(Continued)

OTHER PUBLICATIONS

Cold storage planned for Tampa port, Business Observer, Sep. 2015, p. 2 (Year: 2015).*

(Continued)

*Primary Examiner* — Daniel R Miller
(74) *Attorney, Agent, or Firm* — King & Spalding LLP

(57) ABSTRACT

An electrical system can include a diagnostic device that generates a first test signal at a first time. The electrical system can also include at least one energy transfer link coupled to the diagnostic device, where the first test signal flows through the at least one energy transfer link at the first time. The electrical system can further include a portable electrical load coupled to the at least one energy transfer link. The electrical system can also include a monitoring device coupled to the at least one energy transfer link, where the monitoring device is disposed between the diagnostic device and the portable electrical load. The first monitoring device can receive the first test signal, where the monitoring device executes, in response to the first test signal, a test procedure on the portable electrical load. The portable electrical load is portable relative to the diagnostic device.

19 Claims, 15 Drawing Sheets

(56) References Cited

U.S. PATENT DOCUMENTS

2008/0291850 A1 11/2008 Jensen
2017/0184343 A1 6/2017 Freer et al.

OTHER PUBLICATIONS

A. Semenova, International Search Report and Written Opinion issued in application PCT/US2017/041368, completion date Oct. 26, 2017, dated Nov. 9, 2017, 7 pages, Federal Institute of Industrial Property, Moscow, Russia.

* cited by examiner

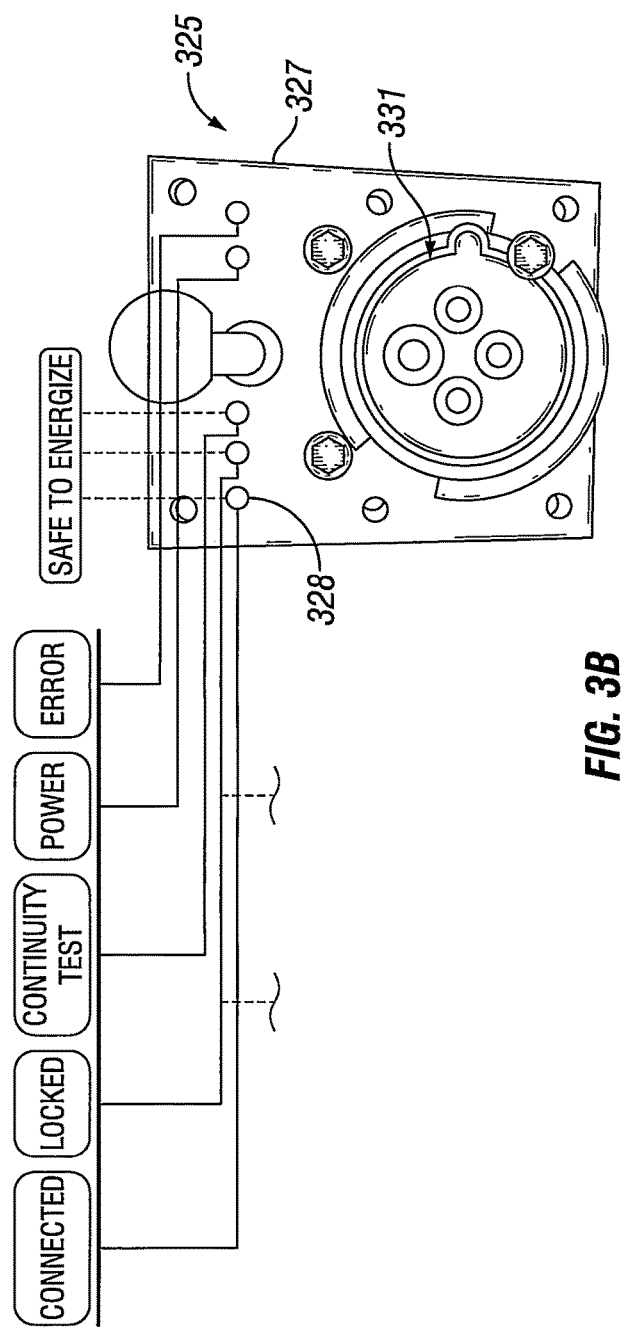
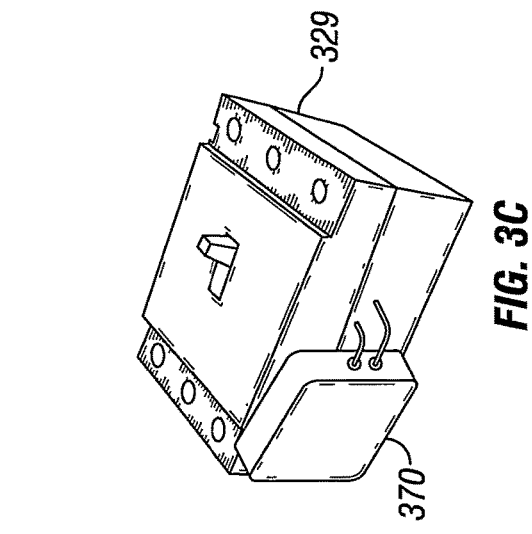
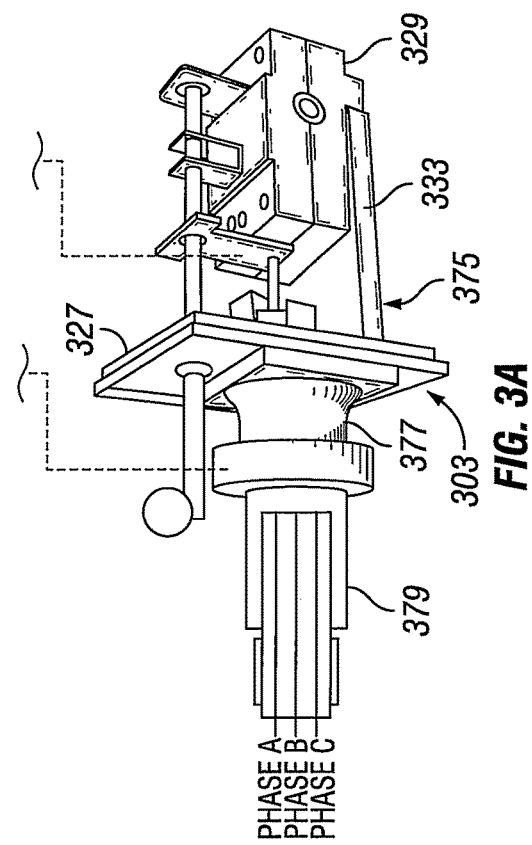
FIG. 3A
FIG. 3B
FIG. 3C

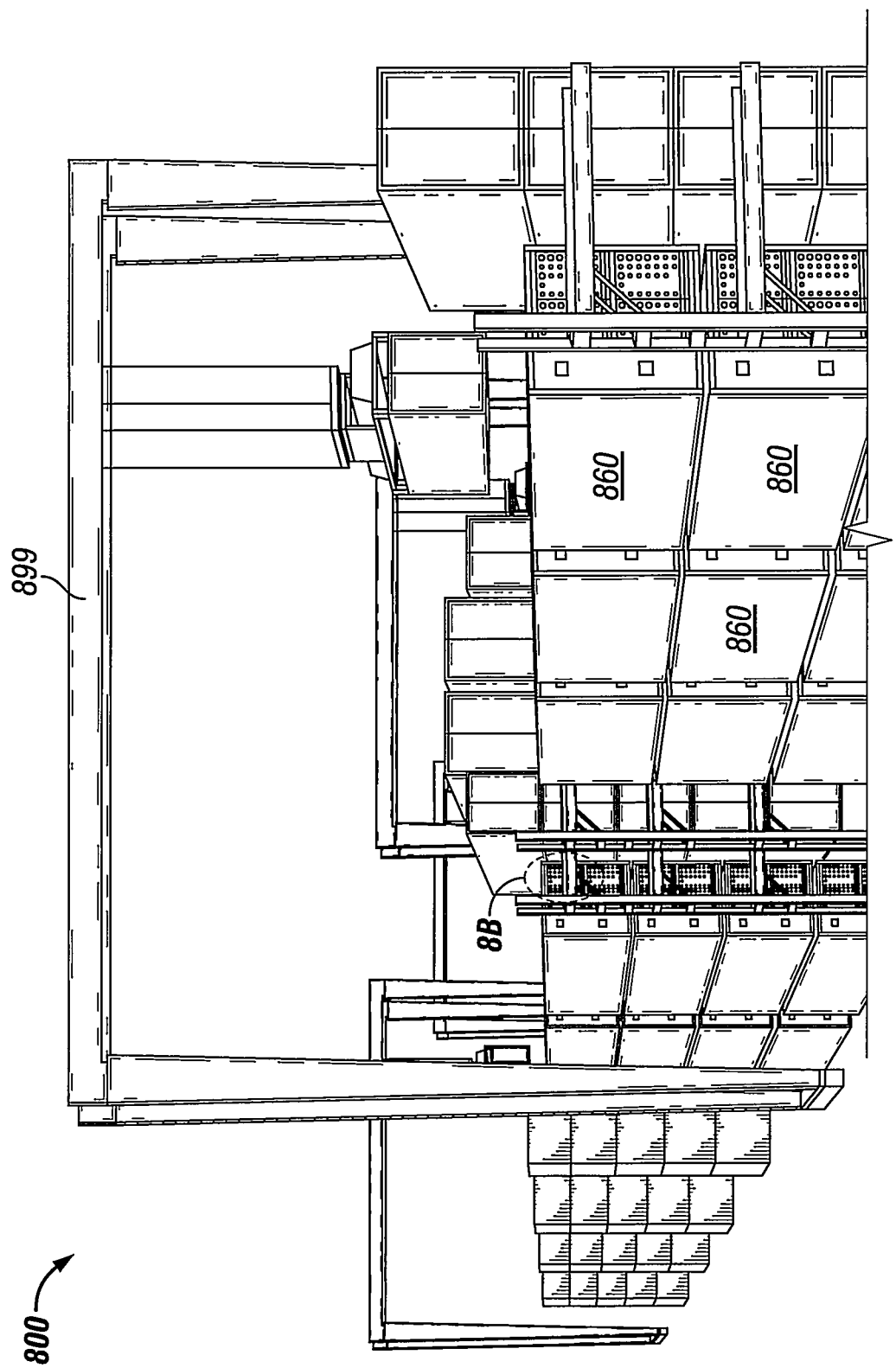

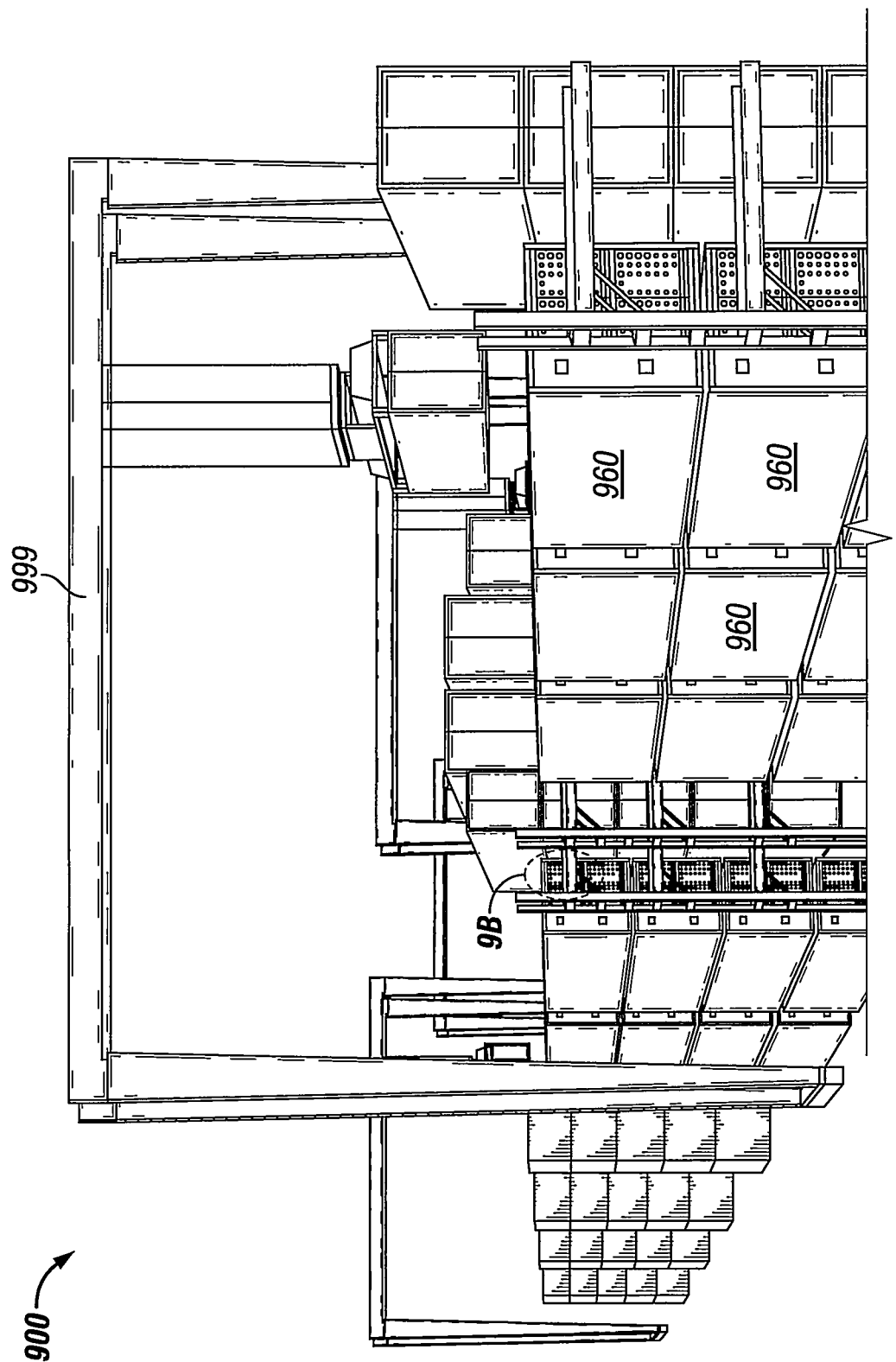

IDENTIFYING AND DETERMINING STATUS OF REEFER CONTAINERS

CROSS-REFERENCE TO RELATED APPLICATIONS

This application claims priority under 35 U.S.C. § 119 to U.S. Provisional Patent Application Ser. No. 62/360,124, titled "Identifying and Determining Status of Reefer Containers" and filed on Jul. 8, 2016. This application is related to U.S. patent application Ser. No. 14/757,614, titled "Testing and Monitoring of an Electrical Connection", filed on Dec. 23, 2015, and to U.S. patent application Ser. No. 15/206,522, titled "Systems And Methods For Testing Electrical Connectors", filed on Jul. 11, 2016. This application is also related to a United States patent application titled "Electrical Network Inspection Devices" filed concurrently herewith and having U.S. patent application Ser. No. 15/645,459. The entire contents of these aforementioned applications are hereby incorporated herein by reference.

TECHNICAL FIELD

The present disclosure relates generally to refrigerated cargo containers (also called reefer containers), and more particularly to systems, methods, and devices for identifying and determining the status of reefer containers.

SUMMARY

In general, in one aspect, the disclosure relates to an electrical system. The electrical system can include a diagnostic device that generates a first test signal at a first time. The electrical system can also include at least one energy transfer link coupled to the diagnostic device, where the first test signal flows through the at least one energy transfer link at the first time. The electrical system can further include a portable electrical load coupled to the at least one energy transfer link. The electrical system can also include a monitoring device coupled to the at least one energy transfer link, where the monitoring device is disposed between the diagnostic device and the portable electrical load. The monitoring device can receive the first test signal, where the monitoring device executes, in response to the first test signal, a test procedure on the portable electrical load. The portable electrical load can be portable relative to the diagnostic device.

In another aspect, the disclosure can generally relate to a reefer container. The reefer container can include an electrical load, and an electrical connector end of the refrigerated cargo container, where the electrical load is electrically coupled to the electrical connector end, where the electrical connector end is configured to couple to a reefer receptacle. The reefer container can also include at least one electrical conductor coupled to the electrical connector end and the electrical load. The reefer container can further include a monitoring device coupled to the at least one electrical conductor and disposed between the electrical connector end and the electrical load. The monitoring device can be configured to receive a test signal from a diagnostic device through the reefer receptacle and the at least one electrical conductor. The monitoring device can use the test signal to conduct a testing procedure on the electrical load in order to determine a condition of the electrical load.

In yet another aspect, the disclosure can generally relate to a method. The method can include receiving, from a diagnostic device, a test signal. The method can also include implementing, in response to the test signal, a test procedure on the electrical load. The test signal, while the test procedure is being administered, can transform into a return signal that is sent to the diagnostic device, where the return signal includes results of the test procedure implemented on the electrical load. The diagnostic device can be configured to determine a condition of the electrical load using the results included in the return signal.

These and other aspects, objects, features, and embodiments will be apparent from the following description and the appended claims.

BACKGROUND

Portable devices often contain components requiring electrical power and in some cases the required electrical power can have relatively high voltage and current ratings. Receptacles have been designed to provide power to such portable devices. Reefer containers are one example of a portable device that requires power. Refrigerated shipping containers are used to ship goods throughout the world. Such refrigerated shipping containers can be transported on trains, trucks, and ships and the containers are often stationed at ports, warehouses, and distribution centers. While the refrigerated containers are located in these various modes of transportation and storage, they often need electrical power to operate the refrigeration unit of the container.

At times, a large number of such devices can be stored at one location, and so a network of receptacles is needed to provide power to each device. When these devices are moved (for example, to prepare for transportation), it can be difficult to identify the device and/or ensure that the receptacle is disconnected The receptacles used for reefer containers are relatively expensive, and damage can easily occur to these receptacles when a receptacle is still connected to a reefer container that is being moved. Also a number of facilities use automated crane systems that lack the intelligence to determine whether a reefer receptacle that is about to be moved is connected to a reefer receptacle.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

FIGS. 3A-3C illustrate a connection assembly in accordance with certain example embodiments.

FIGS. 8A and 8B show a shipping port with a large number of reefer containers.

FIGS. 9A-9C show an example of a diagnostic device disposed in a reefer receptacle at the shipping port of FIGS. 8A and 8B.

DETAILED DESCRIPTION

Figures 1A, 1B:
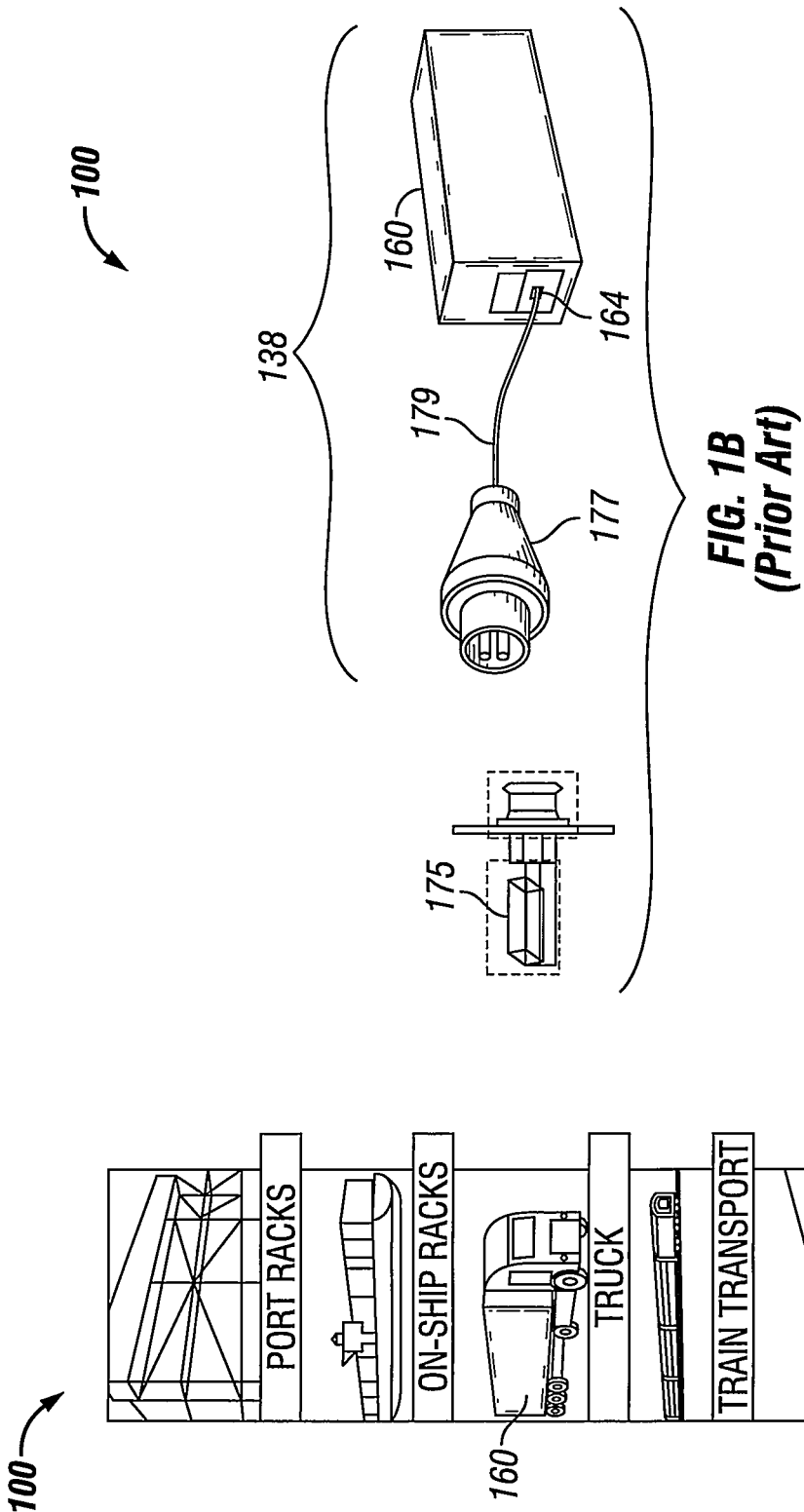
FIGS. 1A and 1B illustrate systems of an example of a typical reefer container and a reefer receptacle currently used in the art.

In general, example embodiments provide systems, methods, and devices for identifying and determining the status of reefer containers. While example systems for identifying and determining the status of reefer containers that are described herein are directed to reefer containers, example embodiments can be used to identify and/or determine the status of any of a number of other devices used for any of a number of other applications. For example, reefer containers can be considered portable electrical equipment, which means that the reefer containers can be physically moved from one location to another and can be electrically coupled (to provide power to the equipment during non-transitory times) and decoupled (to allow the equipment to be moved) to an existing electrical system. As a result, example embodiments can be used to identify and/or determine the status of any other form of portable electrical equipment. Examples of such other portable electrical equipment can include, but are not limited to, a portable generator, an auxiliary pump assembly, a portable HVAC system, mining couplers, and a chemical testing system. Further, example embodiments can be used in one or more of any of a number of environments, including but not limited to hazardous (e.g., explosive) environments, indoors, outdoors, cold temperatures, hot temperatures, high humidity, marine environments, and low oxygen environments.

In addition, the size (e.g., the voltage rating, the current rating) of electrical connectors and electrical conductors coupled to electrical connectors used with example systems can vary. In addition, example embodiments described herein can be designed for any type of voltage (e.g., alternating current (AC), direct current (DC)). For example, as stated above, reefer containers often operate at 480 volts AC and 8-15 amps. Example embodiments described herein can be used in reefer containers of any age, shape, and/or size. For instance, some example embodiments can be used in retrofit applications of existing reefer containers. Example embodiments can be used for systems operating at 600 VAC or less, as for systems that include reefer containers. In addition, or in the alternative, example embodiments can be used for systems operating at more than 600 VAC. For example, example embodiments can be used with mining couplers, which typically operate at approximately 15 kVAC.

As defined herein, a receptacle (or, more generally, an electrical connector) can include any one or more of a number of electrical components. Such electrical components can include, but are not limited to, a connector end of an electrical connector, an electrical cable (including any discrete electrical conductors therein), a bus bar, and a load. An electrical connector or an electrical connector end, as defined herein, can include any of these electrical components.

In the foregoing figures showing example embodiments of systems for identifying and determining the status of reefer containers, one or more of the components shown may be omitted, repeated, and/or substituted. Accordingly, example embodiments of identifying and determining the status of reefer containers should not be considered limited to the specific arrangements of components shown in any of the figures. For example, features shown in one or more figures or described with respect to one embodiment can be applied to another embodiment associated with a different figure or description.

In certain example embodiments, reefer containers for which example embodiments are used are subject to meeting certain standards and/or requirements. For example, the National Electric Code (NEC), the National Electrical Manufacturers Association (NEMA), the International Electrotechnical Commission (IEC), and the Institute of Electrical and Electronics Engineers (IEEE) set standards as to electrical enclosures, wiring, and electrical connections. Use of example embodiments described herein meet (and/or allow a corresponding device and/or electrical enclosure to meet) such standards when required. In some (e.g., reefer container) applications, additional standards particular to that application may be met by the device in which identifying and determining the status of reefer containers are used.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of identifying and determining the status of reefer containers will be described more fully hereinafter with reference to the accompanying drawings, in which example embodiments of identifying and determining the status of reefer containers are shown. Identifying and determining the status of reefer containers may, however, be embodied in many different forms and should not be construed as limited to the example embodiments set forth herein. Rather, these example embodiments are provided so that this disclosure will be thorough and complete, and will fully convey the scope of identifying and determining the status of reefer containers to those of ordinary skill in the art. Like, but not necessarily the same, elements (also sometimes called components) in the various figures are denoted by like reference numerals for consistency.

Terms such as "first", "second", "top", "bottom", "side", "width", "length", "radius", "distal", "proximal", "inner", and "outer" are used merely to distinguish one component (or part of a component or state of a component) from another. Such terms are not meant to denote a preference or a particular orientation, and are not meant to limit embodiments of identifying and determining the status of reefer containers. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIGS. 1A and 1B illustrate an example of systems 100 that include a typical reefer container 160 and a reefer receptacle 175 currently used in the art. Specifically, FIG. 1A shows a number of applications (in this case, port racks, on-ship racks, truck, train transport, and distribution centers) in which a system 100, as detailed in FIG. 1B, is used. In addition to the reefer container 160 and the reefer receptacle 175, FIG. 1B shows a refrigeration unit 164 (part of an electrical load of the reefer container 160) disposed adjacent to the reefer receptacle 175 on the reefer container 160, and an electrical connector 177 disposed at a distal end of an electrical cable 179.

The proximal end of the electrical cable 179 can also have an electrical connector 177 that couples to the reefer container 160. Alternatively, the proximal end of the electrical cable 179 can have exposed leads that couple to a terminal block of the reefer container 160. Also, an electrical cable 179 can be a type of energy transfer link, defined below with respect to FIG. 6. An electrical cable 179 with one or more electrical connectors 177 disposed thereon can be called an electrical cable assembly. One of the electrical connectors 177 is coupled to the reefer receptacle 175. Electrical cables 179 described herein can have any length (e.g., 50 feet, 100 feet). The combination of the electrical connector 177, the electrical cable 179, the refrigeration unit 164, and the reefer container 160 (including any components thereof) can be referred to as a reefer load 138.

An electrical connector 177 can have any of a number variety of configurations. In the example shown in FIG. 1, the electrical connector 177 (also more simply called a connector 177 herein) is a pin-and-sleeve type of connector with four pins. The configuration of the connector 177 is configured to complement the corresponding configuration of the reefer receptacle 175 shown in FIG. 1B. In some cases, to ensure that the connector 177 and the reefer receptacle 175 remain coupled to each other, interlocking features (also called coupling features) are added to the connector 177 and/or the reefer receptacle 175. Such interlocking features can provide added safety by requiring a secure mechanical connection between the reefer receptacle 175 and the connector 177 before power flows between the reefer receptacle 175 and the connector 177.

In the current art, the system 100 fails to efficiently and automatically provide any information regarding the identification of the reefer container 160. As a result, the incorrect reefer container 160 can be selected for transport. Also, the system 100 of the current art fails to efficiently and automatically determine whether the reefer receptacle 175 and the connector 177 are coupled to each other. As a result, when a reefer container 160 is moved, damage can occur to the reefer receptacle 175, the electrical connector 177, and/or the cable 179, any of which can be costly and time-consuming to repair or replace. In addition, other infrastructure (electrical enclosures, other reefer receptacles, conduit, other electrical cables) in proximity and/or coupled to the reefer container 160 and/or the reefer receptacle 175 is susceptible to damage.

Figure 2A:
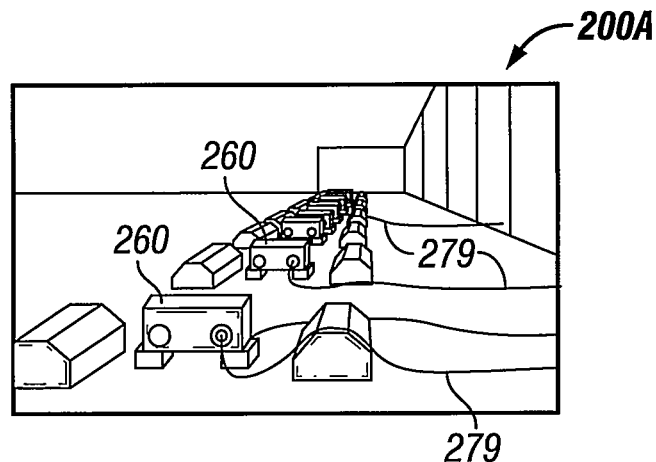
FIGS. 2A-2C show ways that reefer containers are stored during transit.
Figure 2B:
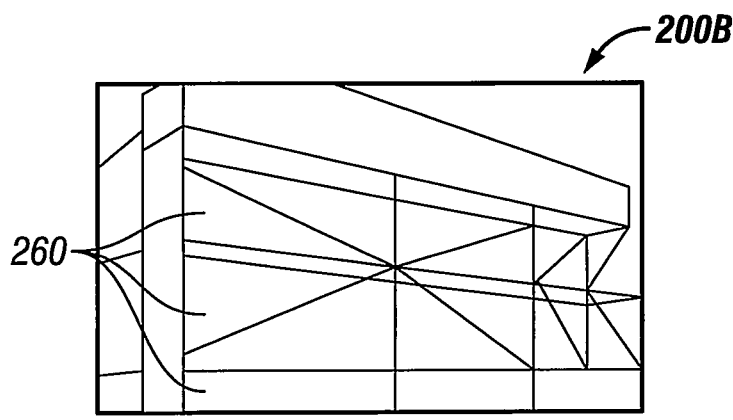

FIGS. 2A and 2B show ways that reefer containers 260 are stored during transit. In FIG. 2A, the system 200A includes a number of reefer receptacles to which reefer containers can be coupled in a horizontal reefer runway, where reefer containers are placed adjacent to each other on the ground. The cables 279 for the reefer containers are laid on the open ground, exposed to any elements and equipment in the area. In FIG. 2B, the system 200B includes a number of reefer containers 260 are stored in a reefer rack, where the reefer containers 260 are stacked vertically in a more dense arrangement and are located closer to the incoming power source.

Figure 2C:
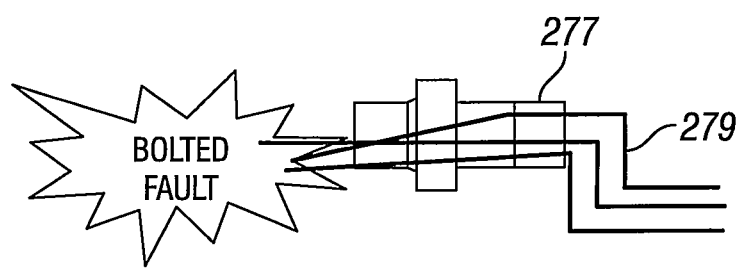

Damage to the connector 277 and/or the electrical cable 279 can produce an unsafe condition, such as a bolted fault (as illustrated in FIG. 2C) or ground fault, when a damaged connector 277 is connected to a reefer receptacle 275 and energized. This unsafe condition can result from moving a different reefer container 260 than the one intended and/or by moving a reefer container 260 where the electrical connector and the reefer receptacle are coupled to each other rather than disconnected from each other. Often times, a number of reefer receptacles are arranged in banks that are proximate to "parking spots" in which a number of reefer containers are placed. In such a case, reefer receptacles in the bank are not assigned to a specific "parking spot". Rather, a user merely connects an electrical connector to the most convenient reefer receptacles in the bank. As a result, human error is more likely to result in having an electrical connector unplugged from a reefer receptacle when the reefer container associated with the electrical connector is about to be moved.

Example embodiments can notify users of the proper identification of a reefer container. Example embodiments can also alert users as to whether the electrical connector (e.g., connector 177) and the reefer receptacle (e.g., reefer receptacle 175) of a particular reefer container (e.g., reefer container 160) are coupled to each other. This can be beneficial to a user when that particular reefer container is about to be moved.

FIGS. 3A-3C show various views of a connection assembly 303 in accordance with certain example embodiments. The connection assembly 303 of FIG. 3A shows an electrical connector 377 coupled to an example reefer receptacle 375. The reefer receptacle 375 of FIGS. 3A-3C include a faceplate 327, a molded case circuit breaker 329 mounted on a tray 333 that extends rear-ward from the faceplate 327, an indicating panel 328 on the front of the faceplate 327, the connector 331 disposed in the faceplate 327, and a controller 370 (also called a diagnostic device 370). The connector 331 of the reefer receptacle 375 has features (e.g., coupling features, interlocking features) that complement the corresponding features of the connector 377.

The diagnostic device 370 can perform any of a number of functions. For example, the diagnostic device 370 can perform safety testing of the electrical connections, conductors, and load before closing the circuit breaker 329 and allowing power to flow therethrough. Further, when working in conjunction with a monitoring device (described below), the diagnostic device 370 can identify a reefer container and/or determine whether the reefer receptacle 375 is coupled to the electrical connector 377. The diagnostic device 370 is shown in FIG. 3C mounted to the exterior of the circuit breaker 329. However, in alternate embodiments, the diagnostic device 370 can be disposed in any of a number of other locations relative to the reefer receptacle 375, including but not limited to within the circuit breaker 329.

The results of tests performed by the diagnostic device 370 and corresponding monitoring device can be communicated in one or more of a number of ways. For example, the indicating panel 328 disposed on the faceplate 327 of the reefer receptacle 375 in FIG. 3B can communicate the status of the system as determined by the diagnostic device 370. In such a case, the indicating panel 328 can indicate that the connector 377 is properly connected to the reefer receptacle 375. As another example, the diagnostic device 370 can send a notification to a crane operator as to whether the reefer receptacle 375 and the electrical connector 377 are connected to each other. In certain example embodiments, the diagnostic device 370 can communicate with a user, a network manager, a central monitoring system, another diagnostic device 370 for another reefer receptacle, and/or any other system that can use data from the diagnostic device 370.

Those of ordinary skill in this field will recognize that the diagnostic device 370 described in FIGS. 3A-3C can be applied to other types of enclosures in both hazardous and non-hazardous environments. For example, instead of the previously described circuit breaker 329, the reefer receptacle 375 can include a manual switching device, such as a relay, a starter, a contactor, or any other type of switch. As with the foregoing example, the alternative switching device can include the diagnostic device 370 to perform testing on the connector 377 and other components before the manual switch is actuated and the reefer receptacle 375 is energized.

In certain example embodiments, the diagnostic device 370 includes a hardware processor. Alternatively, the diagnostic device 370 does not include a hardware processor. In such a case, the diagnostic device 370 can include, as an example, one or more field programmable gate arrays (FPGA), one or more integrated-gate bipolar transistors (IGBTs), and/or one or more integrated circuits (ICs). Using FPGAs, IGBTs, ICs, and/or other similar devices known in the art allows the diagnostic device 370 (or portions thereof) to be programmable and function according to certain logic rules and thresholds without the use of a hardware processor. Alternatively, FPGAs, IGBTs, ICs, and/or similar devices can be used in conjunction with one or more hardware processors.

Figure 4:
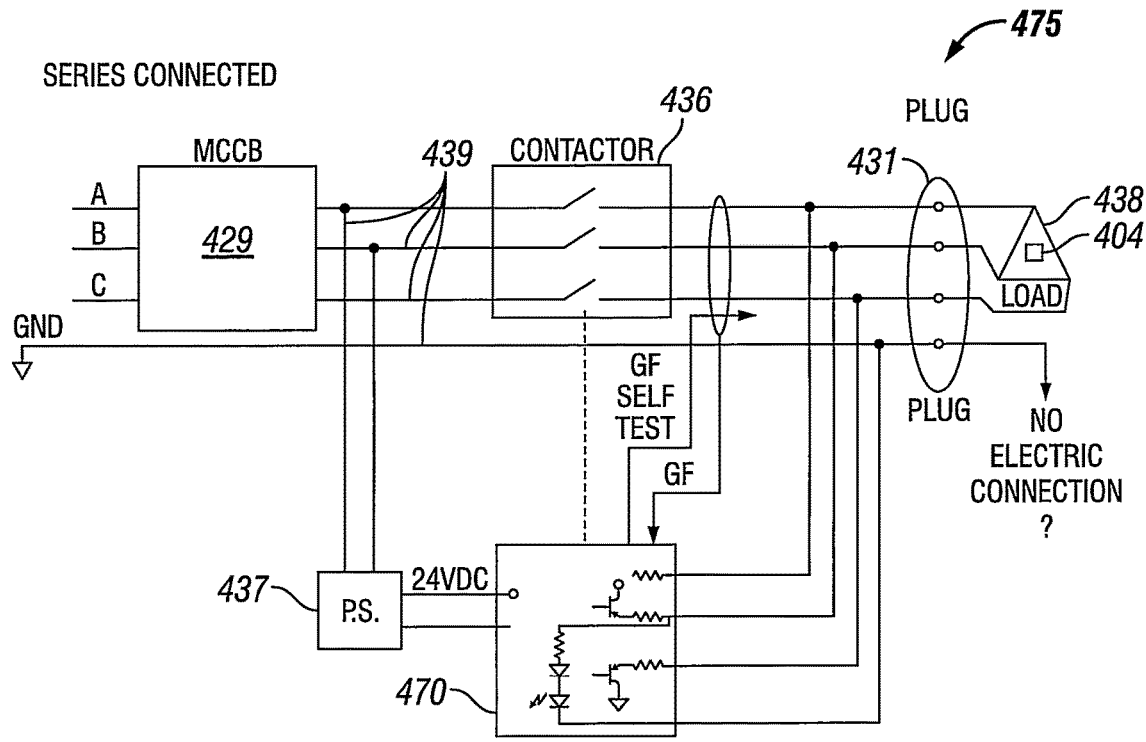
FIG. 4 shows a block diagram of a reefer receptacle in accordance with certain example embodiments.

FIG. 4 shows a block diagram of a reefer receptacle 475 in accordance with certain example embodiments. The reefer receptacle 475 of FIG. 4 includes a diagnostic device 470, a contactor 436, a circuit breaker 429, a power source 437, and a connector 431. All of these components of the reefer receptacle 475 are electrically coupled to each other using electrical conductors 439 (a type of energy transfer link, described below with respect to FIG. 6). The diagnostic device 470 and the contactor 436 in FIG. 4 are each connected in series with the circuit breaker 429 and the connector 431, and in parallel with each other.

The diagnostic device 470 can receive power for performing testing operations via a power source 437. In such a case, the power source 437 creates (using, for example, transformers, inverters, converters, diode bridges) a level and type of power that is used by the diagnostic device 470 from the power flowing between the breaker 429 and the contactor 436. Such power can be called a test signal herein. For example, the power source 437 can create 24 V DC power. In certain example embodiments, the power source 437 creates power that can be considered part of a Class 2 circuit, which means that installation and maintenance of the diagnostic device 470 can be performed by any individual, as opposed to a Class 1 circuit, which can only be installed or maintained by a licensed electrician. Further, Class 2 circuits have substantially lower risk of electrical shock to a user who comes into contact with the diagnostic device 470 or other part of the Class 2 circuit.

The diagnostic device 470 performs testing by transmitting signals (also called test signals) onto one or more of the four electrical conductors 439 (three discrete phase conductors and a ground conductor) of the connector 431 that connects via one or more electrical conductors 439 to a reefer load 438 (also called an electrical load 438). The reefer load 438 in this case includes an example monitoring device 404 and a refrigeration unit, both described in more detail below with respect to FIG. 6.

The diagnostic device 470 can also include one or more components for evaluating reply signals sent by the monitoring device 404. For example, the diagnostic device 470 can measure a voltage drop in a reply signal relative to a test signal sent to the monitoring device 404. The diagnostic device 470 can use the reply signals to identify the reefer container 460 associated with the reefer load 438 and/or determine whether the reefer receptacle 475 and the electrical connector 477 are coupled to each other. In the implementation shown in FIG. 4, the contactor 436 must be rated to handle the voltage and current conducted from the breaker 429 to the connector 431 once the breaker 429 and contactor 436 are closed.

Figure 5:
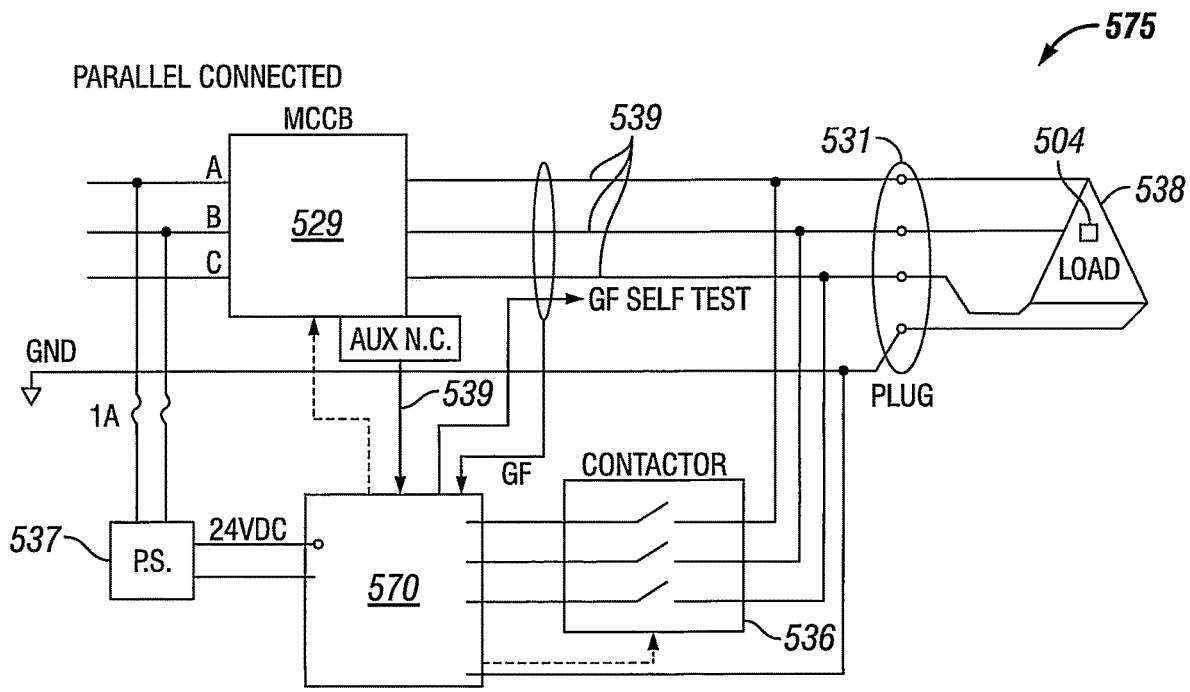
FIG. 5 shows a block diagram of another reefer receptacle in accordance with certain example embodiments.

FIG. 5 shows a block diagram of another reefer receptacle 575 in accordance with certain example embodiments. The reefer receptacle 575 of FIG. 5 includes a diagnostic device 570, a contactor 536, a circuit breaker 529, a power source 537, and a connector 531. All of these components of the reefer receptacle 575 are electrically coupled to each other using electrical conductors 539. The diagnostic device 570 and the contactor 536 in FIG. 5 are connected in series with each other and in parallel with the circuit breaker 529.

In this case, the diagnostic device 470 receives power (e.g., 24 VDC) from the power source 537 and transmits test signals on four electrical conductors 539 (three discrete phase conductors and a ground wire) to the contactor 536. The connector 531 is coupled via electrical conductors 539 to the contactor 536 on one side and to a reefer load 538 (which includes a monitoring device 504) on the other side. As with the diagnostic device 470 of FIG. 4, the diagnostic device 570 of FIG. 5 can also include one or more components for identifying the reefer container 560 associated with the reefer load 538 (also called an electrical load 538) and/or determining whether the reefer receptacle 575 and the electrical connector 577 are coupled to each other.

The diagnostic device 570 can be coupled to the breaker 529 and prevent the breaker 529 from closing if an unsafe condition is detected by the monitoring device 504. The example embodiment shown in FIG. 5 offers advantages over the example embodiment shown in FIG. 4 in that the contactor 536 in FIG. 5 is not required to be as robust as the contactor 436 in FIG. 4 because contactor 536 is not conducting the full current to the connector 531. The contactor 536 also provides electrical isolation of the diagnostic device 570 from the high voltage of the electrical conductors 539 when they are energized, so low voltage detection circuitry can be used. As discussed above, the diagnostic device (e.g., diagnostic device 470, diagnostic device 570) can have any of a number of configurations using any of a number of components.

Figure 6:
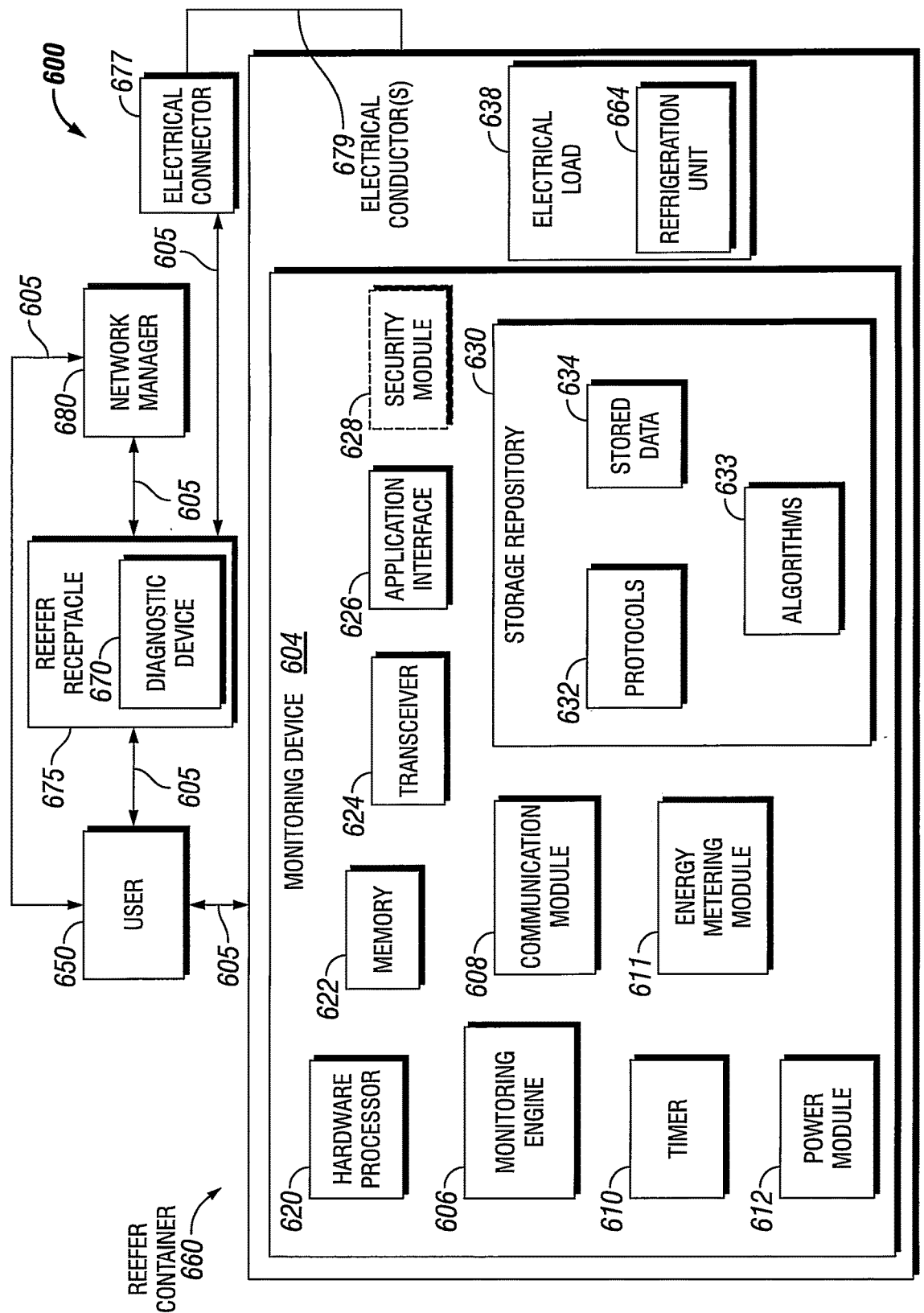
FIG. 6 shows a system diagram of an electrical network that includes a monitoring device in accordance with certain example embodiments.

FIG. 6 shows a diagram of a system 600 that includes a reefer container having a monitoring device 604 (also referred to herein as an inspection device) in accordance with certain example embodiments. In addition to the reefer container 460, the system 600 can include a reefer receptacle 475, one or more users 450, and a network manager 480. The reefer receptacle 475 of FIG. 6 includes a diagnostic device 670, which can be substantially similar to the diagnostic devices described above. In addition to the monitoring device 604, the reefer container 460 can include an electrical load 638 (which includes a refrigeration unit 664) and an electrical connector 677 that is connected to the reefer container 460 by one or more electrical conductors 679.

The electrical load 638 can include any of a number of electrical components and/or devices. Examples of the electrical load 638 can include, but are not limited to, the refrigeration unit 664, a user interface (e.g., indicating lights, control panel), and a control for a locking mechanism. The refrigeration unit 664 can include any of a number of components and/or devices used to control the climate (e.g., temperature, humidity) within the reefer container 660. Such electrical components and/or devices of the refrigeration unit 664 can include, but are not limited to, a compressor, an air moving device, a local controller, and relay.

The monitoring device 604 can include one or more of a number of components. For example, the monitoring device 604 of FIG. 6 includes a monitoring engine 606, a communication module 608, a timer 610, an energy metering module 611, a power module 612, a storage repository 630, a hardware processor 620, a memory 622, a transceiver 624, an application interface 626, and, optionally, a security module 628. The components shown in FIG. 6 are not exhaustive, and in some embodiments, one or more of the components shown in FIG. 6 may not be included in an example monitoring device 604. Any component of the example monitoring device 604 can be discrete or combined with one or more other components of the monitoring device 604.

A user 650 can be any person that interacts, directly or indirectly, with electrical connectors and/or reefer containers. Examples of a user may include, but are not limited to, an engineer, an electrician, a deckhand, a crane operator, an instrumentation and controls technician, a mechanic, an operator, a consultant, a contractor, and a manufacturer's representative. The user 650 can use a user system (not shown), which may include a display (e.g., a GUI). The user 650 interacts with (e.g., sends data to, receives data from) the monitoring device 604 via the application interface 126 (described below). The user 650 can also interact with the network manager 680, the diagnostic device 670, and/or the reefer container 660 in the network 600. Interaction between the user 650 and the network manager 680, diagnostic device 670, and the reefer container 660 can be conducted using one or more energy transfer links 605. Each energy transfer link 605 can include wired (e.g., Class 1 electrical cables, Class 2 electrical cables, electrical connectors, power line carrier, RS485) and/or wireless (e.g., Wi-Fi, visible light communication, cellular networking, Bluetooth, WirelessHART, ISA100) technology. An energy transfer link 605 can transmit signals (e.g., power signals, communication signals, test signals, reply signals, control signals, data) between (and even within) the user 650, the network manager 680, the diagnostic device 670, and the reefer container 660.

The diagnostic device 670 of the reefer receptacle 675 can receive power for performing testing operations via a power source. The diagnostic device 670 can create (using, for example, transformers, inverters, converters, diode bridges) a level and type of power (referred to herein as test signals) that is used for identifying the reefer container 660 and/or determining the integrity of a connection between the reefer receptacle 675 and the electrical connector 677 using the monitoring device 604. For example, the diagnostic device 670 can generate and send low voltage (e.g., 24 V DC power) test signals through one or more energy transfer links 605 (which can include the electrical conductors 679) to the monitoring device 604. The diagnostic device 670 can also include an energy metering module, which can be substantially similar to the energy metering module 611 described below with respect to the monitoring device 604.

The diagnostic device 670 can transmit test signals (e.g., voltage, current) onto one or more energy transfer links 605 to a monitoring device 604. As discussed above, the diagnostic device 670 can also include one or more components for evaluating the electrical and/or mechanical integrity of the electrical device 660 (including associated equipment). For example, the diagnostic device 670 can detect and measure a voltage drop by comparing a reply signal received from the monitoring device 604 with a test signal sent to the monitoring device 604. In detecting and measuring the voltage drop, the diagnostic device 670 can determine the AC line impedance relative to the monitoring device 604.

In certain example embodiments, the test signals generated by the diagnostic device 670 can be addressable and/or include specific instructions for a recipient monitoring device 604. The addressability of a test signal can be based on any of a number of factors, including but not limited to a unique identification number of a monitoring device 604, a frequency, and a passage of time. The diagnostic device 670 can be used when the reefer container 660 in the system 600 is in service. In such a case, however, the diagnostic device 670 may only be used to monitor electrical conditions that flow therethrough. In other words, the diagnostic device 670 may only be able to generate test signals when the portion of the system 600 in which the diagnostic device 670 is located is idle. As defined herein, the term "idle" refers to any equipment that is not operating under its intended purpose at that point in time, regardless of the reason. Examples of times when equipment is idle can include, but are not limited to, during an outage, when the equipment is capable of operation but is not receiving power to operate, and when the equipment is capable of operation but the operation is temporarily interrupted (e.g., for testing). In other words, equipment that is idle can be capable of immediate operation but is not operating at that particular point in time. Idle equipment can also be equipment that is under repair.

In certain example embodiments, the network manager 680 is a device or component that controls all or a portion of the system 600 that includes the monitoring device 604. The network manager 680 can be substantially similar to the diagnostic device 670. Alternatively, the network manager 680 can include one or more of a number of features in addition to, or altered from, the features of the diagnostic device 670 described below. As described herein, communication with the network manager 680 can include communicating with one or more other components (e.g., another diagnostic device 170) of the system 600. In such a case, the network manager 680 can facilitate such communication.

The reefer container 660 can be substantially similar to the reefer containers described above. In addition to the refrigeration unit 664 (part of an electrical load), the monitoring device 604, and the electrical connector 677, the reefer container 660 can include one or more of a number of components, including but are not limited to a motor, a contactor, a circuit breaker, a relay, a transformer, a controller, a terminal block, a cable, a wall outlet, a light fixture, and a heater.

Each monitoring device 604 can use one or more of a number of communication protocols. A monitoring device 604 can be located within the housing of the reefer container 660, disposed on the housing of the reefer container 660, or located outside the housing of the reefer container 660. In some cases, a single monitoring device 604 can be used to inspect or test more than one the reefer container 660. In certain example embodiments, a monitoring device 604 can include a battery that is used to provide power, at least in part, to some or all of the monitoring device 604. The monitoring device 604 can be integrated with and/or coupled to the reefer container 660 in one or more of a number of ways. For example, the monitoring device 604 can be disposed within a potted enclosure. As another example, the monitoring device 604 can integrated with a terminal block or a plug assembly. As yet another example, the monitoring device 604 can integrated with a contactor.

The user 650, the network manager 680, the reefer container 660, and/or the diagnostic device 670 can interact with the monitoring device 604 using the application interface 626 in accordance with one or more example embodiments. Specifically, the application interface 626 of the monitoring device 604 receives data (e.g., information, communications, instructions, updates to firmware, test signals) from and sends data (e.g., information, communications, instructions, reply signals) to the user 650, the network manager 680, and/or the diagnostic device 670. The user 650, the network manager 680, and/or the diagnostic device 670 can include an interface to receive data from and send data to the monitoring device 604 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The monitoring device 604, the user 650, the network manager 680, and/or the diagnostic device 670 can use their own system or share a system in certain example embodiments. Such a system can be, or contain a form of, an Internet-based or an intranet-based computer system that is capable of communicating with various software. A computer system includes any type of computing device and/or communication device, including but not limited to the monitoring device 604. Examples of such a system can include, but are not limited to, a desktop computer with Local Area Network (LAN), Wide Area Network (WAN), Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 7.

Further, as discussed above, such a system can have corresponding software (e.g., user software, auto commissioning system software, network manager software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, LAN, WAN, or other network communication methods) and/or communication channels, with wire and/or wireless segments according to some example embodiments. The software of one system can be a part of, or operate separately but in conjunction with, the software of another system within the system 600.

The monitoring device 604 can include a housing. The housing can include at least one wall that forms a cavity. In some cases, the housing of the monitoring device 604 can be designed to comply with any applicable standards so that the monitoring device 604 can be located in a particular environment (e.g., a hazardous environment). The housing of the monitoring device 604 can be used to house one or more components of the monitoring device 604. For example, the monitoring engine 606, the communication module 608, the timer 610, the energy metering module 611, the power module 612, the storage repository 630, the hardware processor 620, the memory 622, the transceiver 624, the application interface 626, and the optional security module 628 can be disposed in a cavity formed by a housing. In alternative embodiments, any one or more of these or other components of the monitoring device 604 can be disposed on the housing and/or remotely from the housing.

The storage repository 630 can be a persistent storage device (or set of devices) that stores software and data used to assist the monitoring device 604 in communicating with the user 650, the network manager 680, and/or the diagnostic device 670 within the system 600. In one or more example embodiments, the storage repository 630 stores one or more protocols 632, algorithms 633, and stored data 634. The protocols 632 can be any of a number of communication protocols that are used to send and/or receive data between the monitoring device 604, the user 650, the network manager 680, and/or the diagnostic device 670. A protocol 632 can also include a process for identifying and/or testing the reefer container 660 or portions thereof. A protocol 632 can be used for wired and/or wireless communication. Examples of a protocol 632 can include, but are not limited to, Modbus, profibus, Ethernet, and fiberoptic. One or more of the protocols 632 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the protocols 632 can provide a layer of security to the data transferred within the system 600.

The algorithms 633 can be any procedures (e.g., a series of method steps), formulas, logic steps, mathematical models, and/or other similar operational procedures that the monitoring engine 606 of the monitoring device 604 follows based on certain conditions at a point in time. An algorithm 633 can be fixed or modified (e.g., by a user 650, by the monitoring engine 606) over time. Modification of an algorithm 633 can be based on one or more of a number of factors, including but not limited to new equipment (e.g., a new transceiver 624) and correction based on actual data.

Stored data 634 can be any data (e.g., processing speed) associated with the reefer container 660, measurements taken by the energy metering module 611, threshold values, results of previously run or calculated algorithms 633, and/or any other suitable data. Such data can be any type of data, including but not limited to historical data for the reefer container 660, calculations, an identification number of the reefer container 660, measurements taken by the energy metering module 611, and measurements taken by the diagnostic device 670. The stored data 634 can be associated with some measurement of time derived, for example, from the timer 610.

Examples of a storage repository 630 can include, but are not limited to, a database (or a number of databases), a file system, a hard drive, flash memory, some other form of solid state data storage, or any suitable combination thereof. The storage repository 630 can be located on multiple physical machines, each storing all or a portion of the protocols 632, the algorithms 633, and/or the stored data 634 according to some example embodiments. Each storage unit or device can be physically located in the same or in a different geographic location.

The storage repository 630 can be operatively connected to the monitoring engine 606. In one or more example embodiments, the monitoring engine 606 includes functionality to communicate with the user 650, the network manager 680, and the diagnostic device 670 in the system 600. More specifically, the monitoring engine 606 sends information to and/or receives information from the storage repository 630 in order to communicate with the user 650, the network manager 680, and the diagnostic device 670. As discussed below, the storage repository 630 can also be operatively connected to the communication module 608 in certain example embodiments.

In certain example embodiments, the monitoring engine 606 of the monitoring device 604 controls the operation of one or more components (e.g., the communication module 608, the timer 610, the transceiver 624) of the monitoring device 604. For example, the monitoring engine 606 can activate the communication module 608 when the communication module 608 is in "sleep" mode and when the communication module 608 is needed to send data received from another component (e.g., the diagnostic device 670, the user 650) in the system 600.

As another example, the monitoring engine 606 can acquire the current time using the timer 610. The timer 610 can enable the monitoring device 604, even when the monitoring device 604 has no communication with the diagnostic device 670, the network manager 680, and/or the user 650. As yet another example, the monitoring engine 606 can direct the energy metering module 611 to measure and send power consumption information of a circuit associated with reefer container 660 to the diagnostic device 670.

The monitoring engine 606 can be configured to perform a number of functions that help identify the reefer container 660 and/or determine whether the reefer receptacle 675 and the electrical connector 677 are coupled to each other. For example, the monitoring engine 106 can apply a short (a form of test procedure) to two or more energy transfer links 605. As discussed above, the monitoring engine 606 can execute any of the algorithms 633 stored in the storage repository 630. In certain example embodiments, the monitoring engine 606 can perform a number of functions, such as applying an electrical short to one or more electrical conductors (e.g., electrical conductor 679), measuring an impedance on an electrical conductor, detecting an open and/or a short on an electrical conductors in the system 600. In alternative embodiments, the diagnostic device 670 can measure impedances and/or other electrical components to determine whether there is an issue with the electrical load 638 of the reefer container 660.

Any signals sent by the diagnostic device 670 to a monitoring device 604 can be called a test signal, which can include instructions, commands, power, and requests for information. Any signals sent by the monitoring engine 606 of the monitoring device 604 to the diagnostic device 670 can be called return signals and can include information such as identification of the monitoring device 604, identification of the reefer container 660, historical data, results of a test procedure, fault conditions detected, and/or any other suitable information.

The monitoring engine 606, as well as other components of a monitoring device 604, can operate only when a reefer container 660 is idle and when the monitoring device 604 receives a test signal from the diagnostic device 670. In other embodiments, in addition to times when the reefer container 660 is idle, a monitoring device 604 can operate when the reefer container 660 is operating. During the latter scenario, the monitoring device 604 is unable to communicate using a return signal, as when the reefer container 660 is idle. In such a case, the power module 612 of the monitoring device 604 can include an energy storage device (e.g., a battery, a supercapacitor) or other source of power that allows the monitoring device 604 (using the transceiver 624) to communicate with the diagnostic device 670 using wireless communication technology.

In certain example embodiments, the monitoring engine 606 can have one or more of a number of safety features included. For example, before an idle reefer container 660 can receive system power, the monitoring engine 606 can lock out the reefer container 660 until certain test procedures have been run by the monitoring engine 606, the diagnostic device 670 has interpreted the results of those test procedures, the reefer container 660 has been properly identified, and the diagnostic device 670 has determined that the reefer container 660 is reasonably safe for being put back into service.

The monitoring engine 606 can provide control, communication, and/or other similar signals to the user 650 and the diagnostic device 670. Similarly, the monitoring engine 606 can receive control, communication, and/or other similar signals from the user 650 and the diagnostic device 670. The monitoring engine 606 can perform one or more of its functions automatically (for example, based on one or more protocols 632 stored in the monitoring engine 606) and/or based on control, communication, and/or other similar signals received from another device (e.g., receipt of a test signal from the diagnostic device 670) through an energy transfer link 605. The monitoring engine 606 may include a printed circuit board, upon which the hardware processor 620 and/or one or more discrete components of the monitoring device 604 are positioned.

In certain embodiments, the monitoring engine 606 of the monitoring device 604 can communicate with one or more components of a system external to the system 600 in furtherance of inspecting other reefer containers 660 in the network 600. For example, the monitoring engine 606 can interact with an inventory management system by ordering a replacement part for the reefer container 660 that the monitoring engine 606 has determined to fail or be failing. As another example, the monitoring engine 606 can interact with a workforce scheduling system by scheduling a maintenance crew to repair or replace a portion of a reefer container 660 when the monitoring engine 606 determines that the portion of the reefer container 660 requires maintenance or replacement. In this way, the monitoring device 604 is capable of performing a number of functions beyond what could reasonably be considered a routine task.

The monitoring engine 606 (or other components of the monitoring device 604) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit (I²C), and a pulse width modulator (PWM).

The communication module 608 of the monitoring device 604 determines and implements the communication protocol (e.g., from the protocols 632 of the storage repository 630) that is used when the monitoring engine 606 communicates with (e.g., sends reply signals to, receives test signals from) the user 650 and/or the diagnostic device 670. In addition, the communication module 608 can interpret the communication protocol of a communication received by the monitoring device 604 so that the monitoring engine 606 can interpret the communication.

The communication module 608 can send and receive data between the diagnostic device 670 and/or the users 650 and the monitoring device 604. The communication module 608 can send and/or receive data in a given format that follows a particular protocol 632. The monitoring engine 606 can interpret the data packet received from the communication module 608 using the protocol 632 information stored in the storage repository 630. The monitoring engine 606 can also facilitate the data transfer with the diagnostic device 670 and/or a user 650 by converting the data into a format understood by the communication module 608.

The communication module 608 can send data (e.g., protocols 632, algorithms 633, stored data 634, operational information, alarms) directly to and/or retrieve data directly from the storage repository 630. Alternatively, the monitoring engine 606 can facilitate the transfer of data between the communication module 608 and the storage repository 630. The communication module 608 can also provide encryption to data that is sent by the monitoring device 604 and decryption to data that is received by the monitoring device 604. The communication module 608 can also provide one or more of a number of other services with respect to data sent from and received by the monitoring device 604. Such services can include, but are not limited to, data packet routing information and procedures to follow in the event of data interruption.

The timer 110 of the monitoring device 604 can track clock time, intervals of time, an amount of time, and/or any other measure of time. The timer 610 can also count the number of occurrences of an event, whether with or without respect to time. Alternatively, the monitoring engine 606 can perform the counting function. The timer 610 is able to track multiple time measurements concurrently. The timer 610 can track time periods based on an instruction received from the monitoring engine 606, based on an instruction received from the user 650, based on an instruction programmed in the software for the monitoring device 604, based on some other condition or from some other component, or from any combination thereof.

The timer 610 can be configured to track time when there is no power delivered to the monitoring device 604 (e.g., the power module 612 malfunctions) using, for example, a super capacitor or a battery backup. In such a case, when there is a resumption of power delivery to the monitoring device 604, the timer 610 can communicate any aspect of time to the monitoring device 604. In such a case, the timer 610 can include one or more of a number of components (e.g., a super capacitor, an integrated circuit) to perform these functions.

The energy metering module 611 of the monitoring device 604 measures one or more components of power (e.g., current, voltage, resistance, impedance, VARs, watts) at one or more electrical conductors (a type of energy transfer link 605) feeding the reefer container 660. The energy metering module 611 can include any of a number of measuring devices and related devices, including but not limited to a voltmeter, an ammeter, a power meter, an ohmmeter, a current transformer, a potential transformer, and electrical wiring. The energy metering module 611 can measure a component of power continuously, periodically, based on the occurrence of an event, based on a command received from the control module 606, and/or based on some other factor.

The power module 612 of the monitoring device 604 provides power to one or more other components (e.g., timer 610, monitoring engine 606) of the monitoring device 604. The power module 612 can also generate power (e.g., current source, voltage source) that is used to test the reefer container 660. For example, the power module 612 can control a current set point that flows through part of the reefer container 660 of the system 600 for testing (identifying, verifying, determining) the reefer container 660.

In some cases, the power module 612 can control multiple current set points, where the monitoring engine 606 can dictate which current set point is used at a given point in time. For example, during normal operating conditions, the power module 612 can have the current set point be very low (e.g., 1.2 mA). Alternatively, during times when the downstream electrical load 638 is out of service, the power module 612 can have the current set point be relatively high (e.g., 7 mA). In this way, when the downstream electrical load 638 is out of service or otherwise idle and the diagnostic device 670 is sending test signals to the monitoring device 604, the power module 612 can generate a predictable and noticeable load current. This high current set point can be measured at the diagnostic device 670 due to the high impedance (a known value) of the diagnostic device 670. This allows for several volts of signal to transfer data between the diagnostic device 670 and the monitoring device 604.

The power module 612 can include one or more of a number of single or multiple discrete components (e.g., transistor, diode, resistor, fuse, capacitor), and/or a microprocessor. The power module 612 may include a printed circuit board, upon which the microprocessor and/or one or more discrete components are positioned. In some cases, the power module 612 can include one or more components that allow the power module 612 to measure one or more elements of power (e.g., voltage, current) that is delivered to and/or sent from the power module 612, Alternatively, the monitoring device 604 can include a power metering module (not shown) to measure one or more elements of power that flows into, out of, and/or within the monitoring device 604. The power module 612 can receive its power from the diagnostic device 670.

The power module 612 can include one or more components (e.g., a transformer, a diode bridge, an inverter, a converter) that receives power (for example, through electrical conductor 679) from a source (e.g., the diagnostic device 670) external to the monitoring device 604 and generates power of a type (e.g., alternating current, direct current) and level (e.g., 12V, 24V, 120V) that can be used by the other components of the monitoring device 604. The power module 612 can use a closed control loop to maintain a preconfigured voltage or current with a tight tolerance at the output. The power module 612 can also protect the rest of the electronics (e.g., hardware processor 620, transceiver 624) in the monitoring device 604 from surges generated in the line.

In addition, or in the alternative, the power module 612 can be a source of power in itself to provide signals to the other components of the monitoring device 604. For example, the power module 612 can be (or include) a battery, a supercapacitor, or some other form of energy storage device. As another example, the power module 612 can be a localized photovoltaic power system.

The hardware processor 620 of the monitoring device 604 executes software, algorithms, and firmware in accordance with one or more example embodiments. Specifically, the hardware processor 620 can execute software on the monitoring engine 606 or any other portion of the monitoring device 604, as well as software used by another portion of the reefer container 660, the user 650, the network manager 680, and/or the diagnostic device 670. The hardware processor 620 can be an integrated circuit, a central processing unit, a multi-core processing chip, SoC, a multi-chip module including multiple multi-core processing chips, or other hardware processor in one or more example embodiments. The hardware processor 620 is known by other names, including but not limited to a computer processor, a microprocessor, and a multi-core processor.

In one or more example embodiments, the hardware processor 620 executes software instructions stored in memory 622. The memory 622 includes one or more cache memories, main memory, and/or any other suitable type of memory. The memory 622 can include volatile and/or non-volatile memory. The memory 622 is discretely located within the monitoring device 604 relative to the hardware processor 620 according to some example embodiments. In certain configurations, the memory 622 can be integrated with the hardware processor 620.

In certain example embodiments, the monitoring device 604 does not include a hardware processor 620. In such a case, the monitoring device 604 can include, as an example, one or more FPGAs, one or more IGBTs, and/or one or more ICs. Using FPGAs, IGBTs, ICs, and/or other similar devices known in the art allows the monitoring device 604 (or portions thereof) to be programmable and function according to certain logic rules and thresholds without the use of a hardware processor. Alternatively, FPGAs, IGBTs, ICs, and/or similar devices can be used in conjunction with one or more hardware processors 620.

The transceiver 624 of the monitoring device 604 can send and/or receive control and/or communication signals. Specifically, the transceiver 624 can be used to transfer data between the monitoring device 604 and the user 650, the network manager 680, and/or the diagnostic device 670. The transceiver 624 can use wired and/or wireless technology. The transceiver 624 can be configured in such a way that the control and/or communication signals sent and/or received by the transceiver 624 can be received and/or sent by another transceiver that is part of the user 650, the network manager 680, and/or the diagnostic device 670. The transceiver 624 can use any of a number of signal types, including but not limited to radio frequency signals.

When the transceiver 624 uses wireless technology, any type of wireless technology can be used by the transceiver 624 in sending and receiving signals. Such wireless technology can include, but is not limited to, Wi-Fi, visible light communication, cellular networking, and Bluetooth. The transceiver 624 can use one or more of any number of suitable communication protocols (e.g., ISA100, HART) when sending and/or receiving signals. Such communication protocols can be stored in the protocols 632 of the storage repository 630. Further, any transceiver information for the user 650, the network manager 680, and/or the diagnostic device 670 can be part of the stored data 634 (or similar areas) of the storage repository 630.

Optionally, in one or more example embodiments, the security module 628 secures interactions between the monitoring device 604, the user 650, the network manager 680, and/or the diagnostic device 670. More specifically, the security module 628 authenticates communication from software based on security keys verifying the identity of the source of the communication. For example, user software may be associated with a security key enabling the software of the user 650 to interact with the monitoring device 604 and/or the diagnostic device 670. Further, the security module 628 can restrict receipt of information, requests for information, and/or access to information in some example embodiments.

As stated above, the monitoring device 604 can be placed in any of a number of environments. In such a case, the housing of the monitoring device 604 can be configured to comply with applicable standards for any of a number of environments. For example, the monitoring device 604 can be rated as a Division 1 or a Division 2 enclosure under NEC standards. Similarly, any other devices of the reefer container 660, including the reefer container 660 itself, communicably coupled to the monitoring device 604 can be configured to comply with applicable standards for any of a number of environments.

When a test signal is received by a recipient monitoring device 604, the recipient monitoring device 604 can send a reply signal acknowledging receipt of the test signal. In such a case, the diagnostic device 670 can send another test signal addressed to the recipient monitoring device 604 with instructions for the recipient monitoring device 604 to execute (implement) one or more of a number of test procedures. Alternatively, the initial test signal can include, along with the address of (or a request for) the recipient monitoring device 604, such instructions for the recipient monitoring device 604 to execute the test procedures.

A test procedure can be any of a number of actions taken by a recipient monitoring device 604 to test an aspect of the electrical circuit that includes the electrical load 638 associated with the recipient monitoring device 604 and the reefer container 660. Each test procedure can be embedded in the test signals, a protocol 632 stored in the storage repository 630 of the monitoring device 604, and/or obtained in any of a number of other ways. An example of an action taken by a recipient monitoring device 604 as part of a test procedure is applying a short across two energy transfer links 605, electrical conductors 679 (e.g., the neutral and A-phase electrical conductors), or the like.

Once the recipient monitoring device 604 executes a test procedure, the test signal sent by the diagnostic device 670 has a return path to the diagnostic device 604. The signal that returns after flowing through the circuitry manipulated by the recipient monitoring device 604 as part of the test procedure is a return signal. The diagnostic device 670, upon receiving a return signal, can analyze the return signal (e.g., based on the test procedure executed by the recipient monitoring device 604, by comparing the return signal to the test signal) to determine a condition of the electrical load 638 and its associated circuitry (e.g., electrical conductors 679, refrigeration unit 664).

For example, the impedance along the path traveled by the test signal and the corresponding return signal can be known or otherwise determined. In such a case, the voltage drop of the return signal relative to the test signal can be determined and analyzed by the diagnostic device 670. If the voltage drop is high, this could represent an open circuit. When multiple phases are involved, the superposition of two phases can identify which phase requires service. For example, a large drop voltage measured on A-B and on B-C indicates that B phase requires service.

As a specific example in order to verify adequate connection between the reefer receptacle 675 and the electrical connector 677 of the reefer container 660, the diagnostic device 670 can be integrated with a reefer receptacle 675. In addition, one or more monitoring devices 604 can be wired to the electrical load 638 (including the refrigeration unit 664) of the reefer container 660.

In such a case, when the electrical load 638 is idle, the diagnostic device 670 sends a test signal (e.g., applies 24 VDC to the reefer receptacle 675 (e.g., for a single phase of power)), and each embedded monitoring device 604 receives a test signal. The diagnostic device 670 can cycle the test signal in accordance with a communication protocol to query the potential embedded monitoring devices 604. Using a time-multiplexing protocol, after each embedded monitoring device 604 receives the test signal (e.g., is queried), the monitoring device 604 can respond by shorting the voltage phase on which the test signal was sent (that has been performing the query) in accordance with the communication protocol. In this case, shorting the voltage phase is implementing (executing, performing) a test procedure. Each test signal returns to the diagnostic device 670 as a return signal.

The diagnostic device 670 repeats this process of sending the test signals on the remaining voltage phases, and the recipient monitoring devices 604 execute the corresponding test procedures based on receiving those test signals. Similarly, each test signal returns to the diagnostic device 670 as a return signal. Upon receiving these return signals, the diagnostic device 670 can then record which embedded monitoring devices 604 were present on each voltage line.

Any open circuits in the circuitry associated with the electrical load 638 can be determined by the diagnostic device 670 when a three-phase monitoring device 604 only responds (performs a test procedure) on a single phase or on two phases. (In such a case, it is assumed that there would be separate single or three-phase test signals.) In addition, or in the alternative, an open in the circuitry associated with the electrical load 638 can be determined by the diagnostic device 670 when a known monitoring device 604 failed to respond (did not perform a test procedure) to a query (test signal).

As a specific example in order to verify line resistances within the electrical load 638 of the reefer container 660, the diagnostic device 670 can be integrated with a reefer receptacle 675. In addition, one or more monitoring devices 604 can be wired to the electrical load 638 (including the refrigeration unit 664) of the reefer container 660.

In such a case, when the electrical load 638 is idle, the diagnostic device 670 sends a test signal (e.g., applies 24 VDC to the reefer receptacle 675 (e.g., for a single phase of power)), and each embedded monitoring device 604 receives a test signal. The diagnostic device 670 can cycle the test signal in accordance with a communication protocol to query the potential embedded monitoring devices 604. Using a time-multiplexing protocol, after each embedded monitoring device 604 receives the test signal (e.g., is queried), the monitoring device 604 can respond by shorting the voltage phase on which the test signal was sent (that has been performing the query) in accordance with the communication protocol. In this case, shorting the voltage phase is implementing (executing, performing) a test procedure. Each test signal returns to the diagnostic device 670 as a return signal.

The diagnostic device 670 repeats this process of sending the test signals on the remaining voltage phases, and the recipient monitoring devices 604 execute the corresponding test procedures based on receiving those test signals. Similarly, each test signal returns to the diagnostic device 670 as a return signal. Upon receiving these return signals, the diagnostic device 670 can then record which embedded monitoring devices 604 were present on each voltage line.

The diagnostic device 670 can then apply a test signal (e.g., 24 VDC) to all three phases, and so all monitoring devices 604 coupled to the circuitry associated with the electrical load 638 receive the test signals and become activated (e.g., receive power). The diagnostic device 670 can then begin a routine of instructing a monitoring device 604 to perform a test procedure of shorting its power line at a known current level. Upon receiving the resulting return signal, the diagnostic device 670 can measure the voltage drop across the two terminals of the shorted line, and then calculate line resistance. The diagnostic device 670 can then repeat this process, instructing every monitoring device 604 to short every available phase (perform testing procedures). The diagnostic device 670 can then use each resulting return signal to calculate the line resistance of every connection in the circuitry associated with the electrical load 638.

Figure 7:
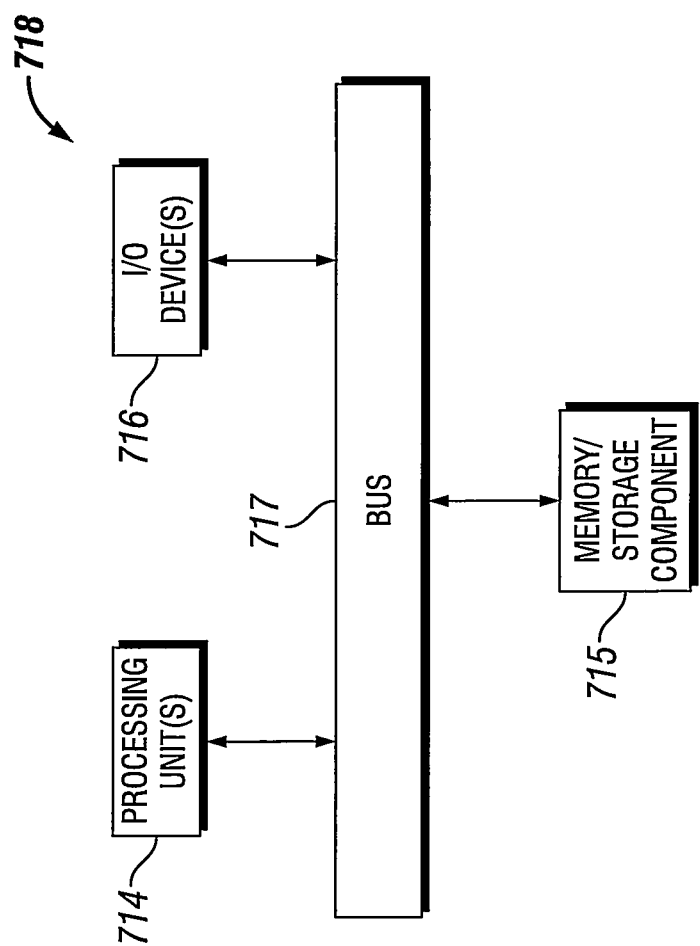
FIG. 7 shows a computing device in accordance with certain example embodiments.

FIG. 7 illustrates one embodiment of a computing device 718 that implements one or more of the various techniques described herein, and which is representative, in whole or in part, of the elements described herein pursuant to certain exemplary embodiments. Computing device 718 is one example of a computing device and is not intended to suggest any limitation as to scope of use or functionality of the computing device and/or its possible architectures. Neither should computing device 718 be interpreted as having any dependency or requirement relating to any one or combination of components illustrated in the example computing device 718.

Computing device 718 includes one or more processors or processing units 714, one or more memory/storage components 715, one or more input/output (I/O) devices 716, and a bus 717 that allows the various components and devices to communicate with one another. Bus 717 represents one or more of any of several types of bus structures, including a memory bus or memory controller, a peripheral bus, an accelerated graphics port, and a processor or local bus using any of a variety of bus architectures. Bus 717 includes wired and/or wireless buses.

Memory/storage component 715 represents one or more computer storage media. Memory/storage component 715 includes volatile media (such as random access memory (RAM)) and/or nonvolatile media (such as read only memory (ROM), flash memory, optical disks, magnetic disks, and so forth). Memory/storage component 715 includes fixed media (e.g., RAM, ROM, a fixed hard drive, etc.) as well as removable media (e.g., a Flash memory drive, a removable hard drive, an optical disk, and so forth).

One or more I/O devices 716 allow a customer, utility, or other user to enter commands and information to computing device 718, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 718 is connected to a network (not shown) (e.g., a LAN, a WAN such as the Internet, cloud, or any other similar type of network) via a network interface connection (not shown) according to some exemplary embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other exemplary embodiments. Generally speaking, the computer system 718 includes at least the minimal processing, input, and/or output means necessary to practice one or more embodiments.

Further, those skilled in the art will appreciate that one or more elements of the aforementioned computer device 718 is located at a remote location and connected to the other elements over a network in certain exemplary embodiments. Further, one or more embodiments is implemented on a distributed system having one or more nodes, where each portion of the implementation (e.g., monitoring engine 606) is located on a different node within the distributed system. In one or more embodiments, the node corresponds to a computer system. Alternatively, the node corresponds to a processor with associated physical memory in some exemplary embodiments. The node alternatively corresponds to a processor with shared memory and/or resources in some exemplary embodiments.

Figure 8B:
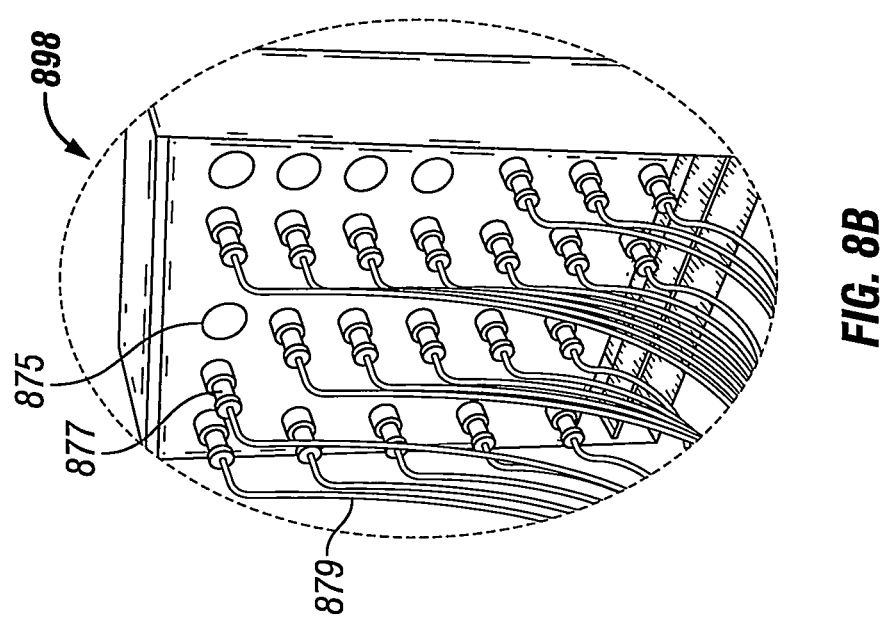

FIGS. 8A and 8B show a system 800 (in this case, a shipping port) with a large number of reefer containers 860. Referring to FIGS. 1A-8B, as can be seen in FIG. 8A, the reefer containers 860 are stacked in clusters that are 5 high, 3 deep, and an indeterminate number wide. A crane 899 is used to move the reefer containers 860. When the reefer containers 860 are stacked in place, a panel 898, as shown in FIG. 8B, is used to provide power to each of the reefer containers 860. Each panel 898 has a number of reefer receptacles 875 that are accessible to a number of electrical connectors 877. When an electrical connector 877 of a reefer container 860 is coupled to a reefer receptacle 875, power flows through the electrical conductors 879 to the reefer container 860.

Each electrical connector 877 of a reefer container 860 must be manually plugged into (coupled to) a reefer receptacle 875 in the panel 898 by a user when the reefer container 860 is placed for holding by the crane 899. Similarly, each electrical connector 877 of a reefer container 860 must be manually unplugged (decoupled) from the reefer receptacle 875 in the panel 898 by a user prior to the crane 899 retrieving the reefer container 860. As shown in FIG. 8, because of the proximity of the reefer receptacles 875 in the panel 898, and because of the length of the electrical conductors 879, it is difficult to determine which reefer receptacle 875 is providing power to which reefer container 860.

In other words, mistakes can be made in not coupling an electrical connector 877 of a reefer container 860 to an operating reefer receptacle 875 in a timely manner, thereby risking the integrity of the goods stored within the reefer container 860. Similarly, mistakes can be made in not uncoupling an electrical connector 877 of a reefer container 860 from the reefer receptacle 875 prior to moving the reefer container 860, thereby damaging the reefer receptacle 875, the electrical connector 877, the electrical conductors 879, and/or other equipment.

Figure 9C:
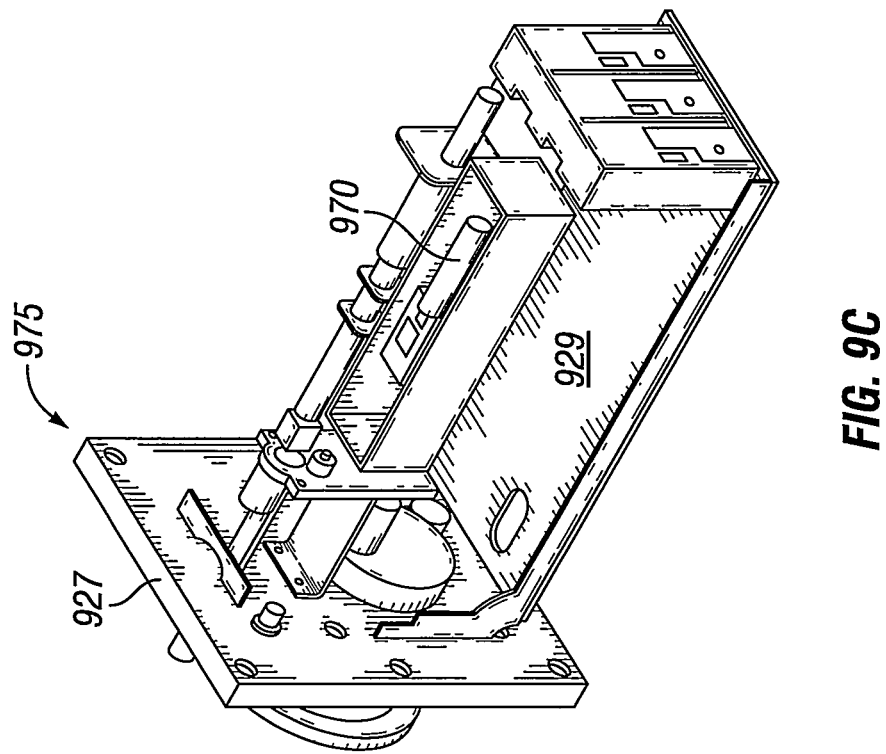
Figure 9B:
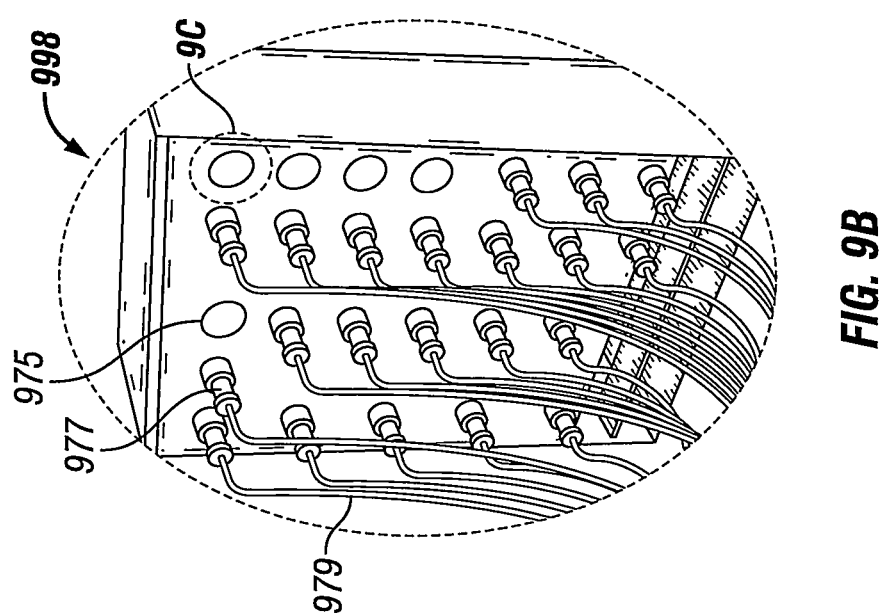
Figure 10A:
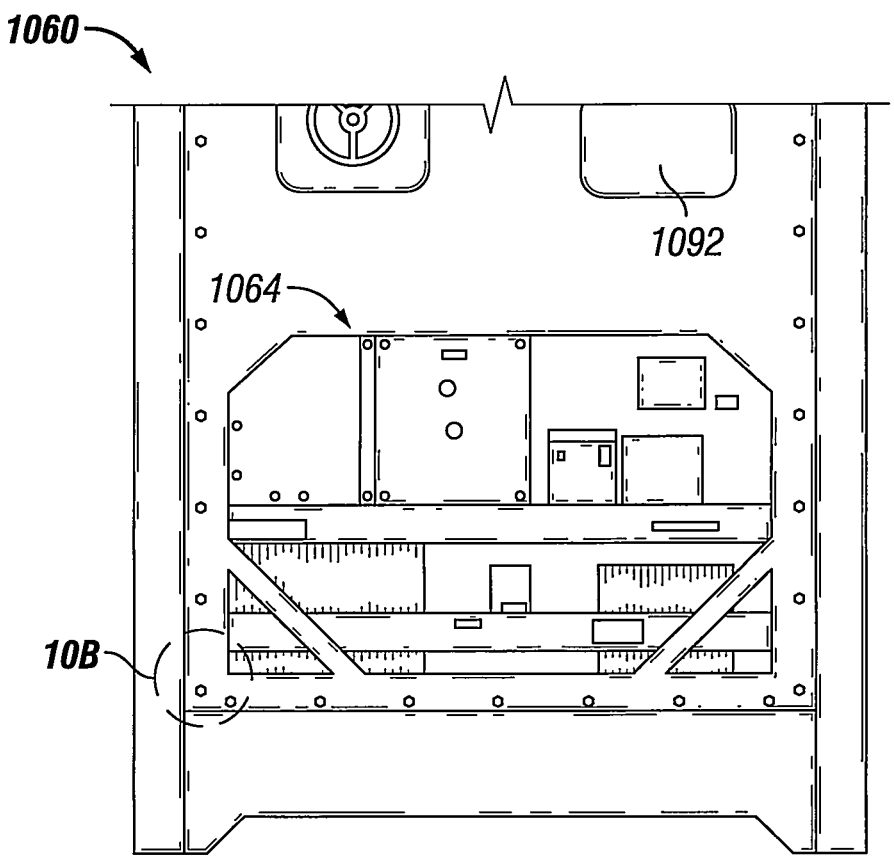
FIGS. 10A-10C show a monitoring device disposed in a reefer container at the shipping port of FIGS. 8A and 8B.
Figure 10B:
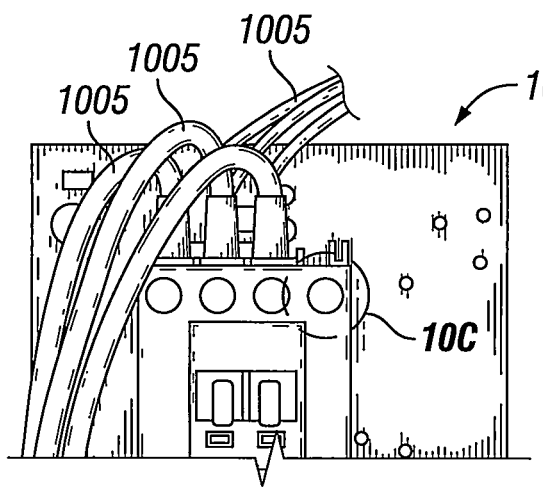
Figure 10C:
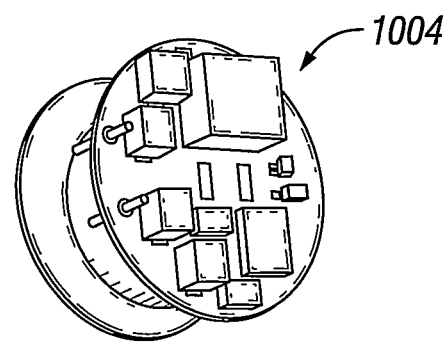

FIGS. 9A-9C show a system 900 (substantially similar to the system 800 shown in FIGS. 8A and 8B), except that an example diagnostic device 970 is disposed in a reefer receptacle 975. In this way, the reefer receptacle 975 can be similar to the reefer receptacles described above with respect to FIGS. 3-7. FIGS. 10A-10C show a reefer container 1060 that includes an example monitoring device 1004. The reefer container 1060 can be substantially similar to the reefer container 660 described above with respect to FIG. 6, and the reefer container 1060 can be included in a system, such as system the 900 of FIGS. 9A-9C.

Referring to FIGS. 1A-10C, by using the example monitoring device 1004 with the diagnostic device 970, example embodiments can perform a number of important functions. Examples of such functions can include, but are not limited to, detection of electrical shorts, monitoring of equipment (e.g., breakers) associated with a reefer container, identification of a reefer container, determination of whether a reefer receptacle is providing power to a reefer container (and if so, which specific reefer container 1060 is coupled to which specific reefer receptacle 975), indicate the status of a reefer container, and perform metering functions.

Example monitoring devices 1004 and diagnostic devices 970 can communicate with each other and/or with other components (e.g., network manager) of the system 900 wirelessly (e.g., using WiFi) and/or using wired communication (e.g., energy transfer links). In certain example embodiments, such as is shown in FIGS. 10A-10C, the monitoring device 1004 can be wired to a voltage terminal (e.g., 480 VAC) of the reefer container 1060 to "tag" the reefer container 1060 with a unique identifier.

Figure 11:
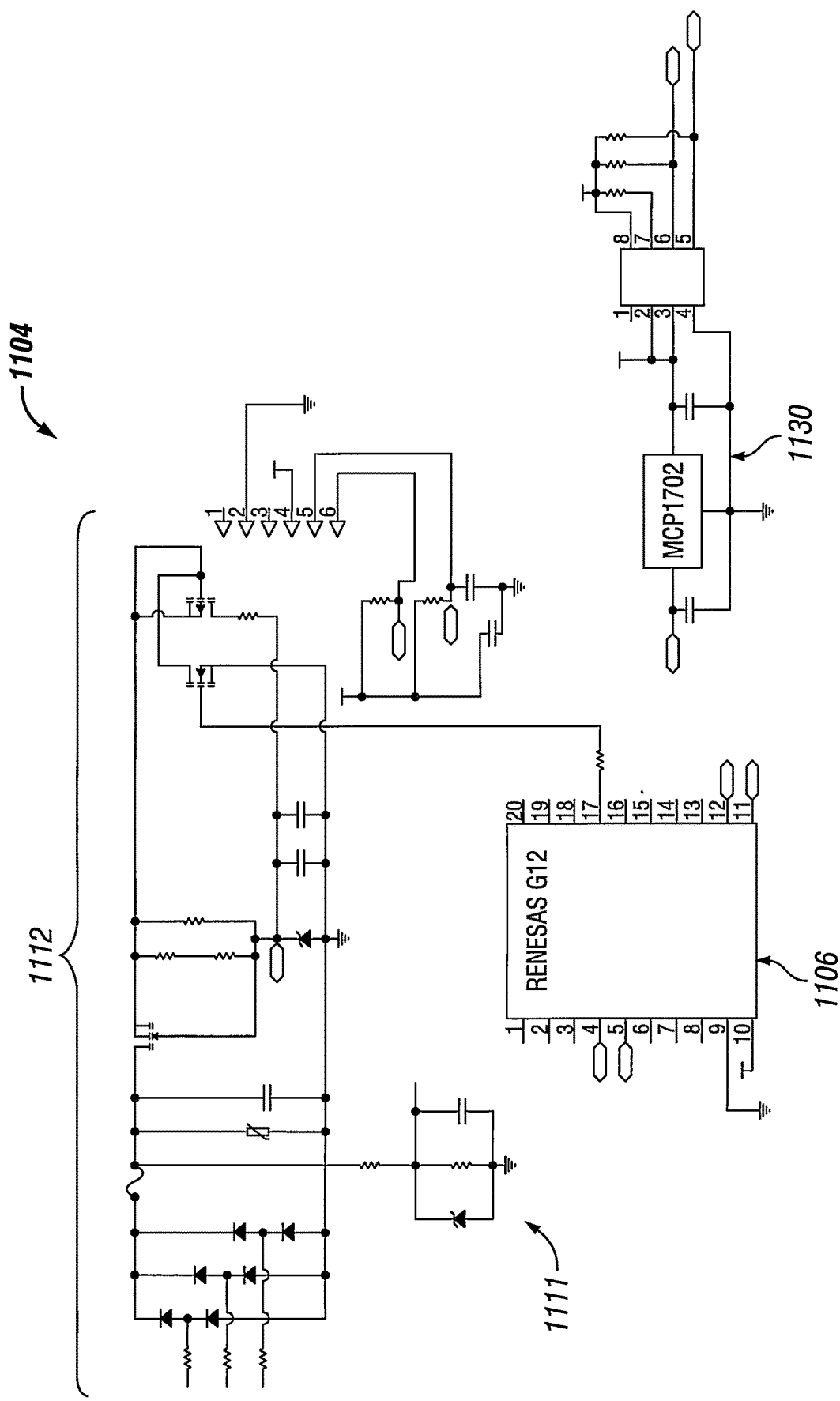
FIG. 11 shows a circuit diagram of a monitoring device in accordance with certain example embodiments.
Figure 12:
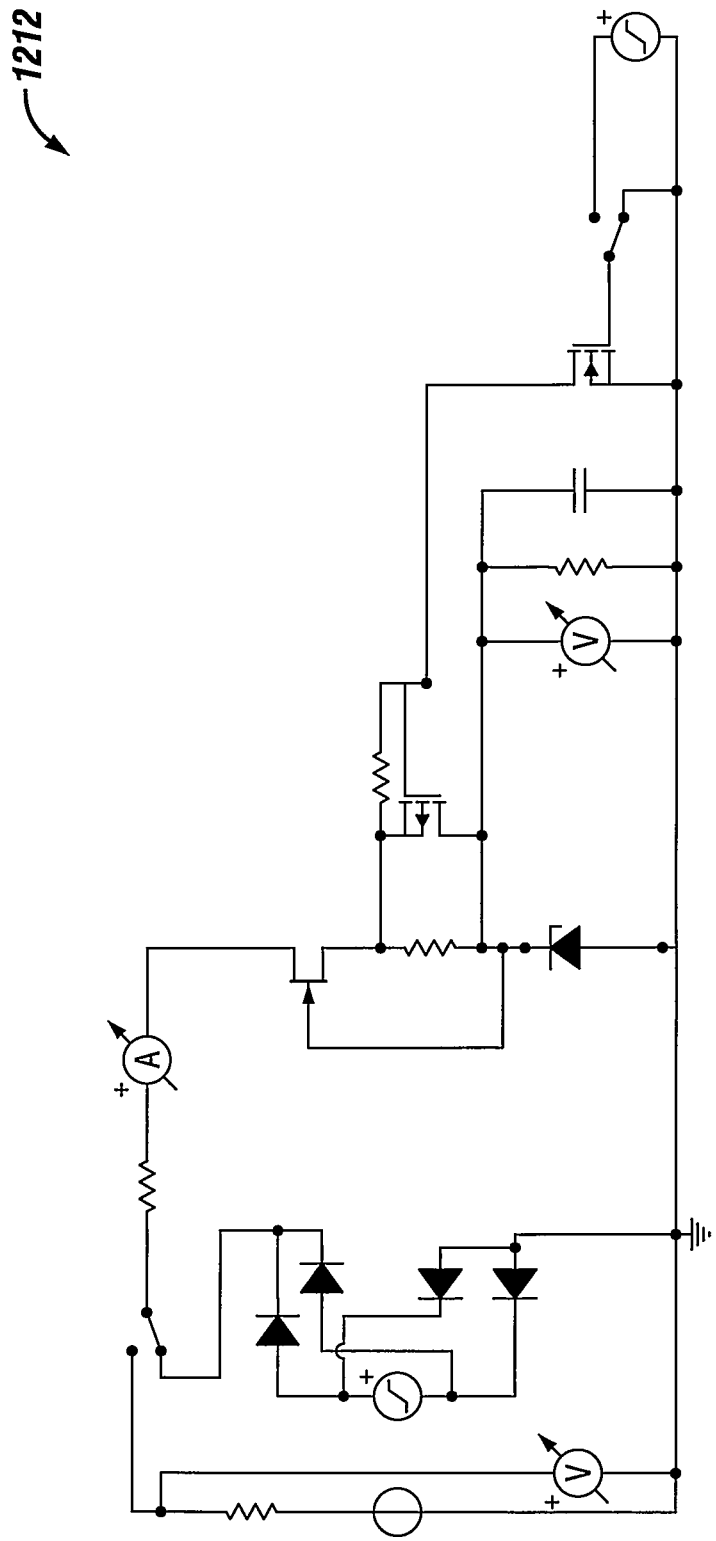
FIG. 12 shows a circuit diagram of a power module of a monitoring device in accordance with certain example embodiments.

FIG. 11 shows a circuit diagram of a monitoring device 1104 in accordance with certain example embodiments. FIG. 12 shows a circuit diagram of a power module 1212 of a monitoring device in accordance with certain example embodiments. Referring to FIGS. 1-12, the circuitry of the example monitoring device 1104 is shown for a power module 1112, an energy metering module 1111, a monitoring engine 1106, and a storage repository 1130 are shown. The circuitry for the example power module 1212 of FIG. 12 differs from that of the power module 1112 of FIG. 11. Further, the power module 1212 of FIG. 12 includes various components (e.g., voltmeter, ammeter) of the energy metering module of the monitoring device.

The diagnostic device of a corresponding reefer receptacle can receive power from a power source and generate a test signals (in this case, 24 V DC). The test signals can be applied to one or more of the energy transfer links (e.g., electrical conductors 679). As an example, the test signals can be applied to the neutral leg of a 4-wire, 3-phase configuration that feeds the reefer container through the electrical connector (e.g., electrical connector 677).

The test signals generated by the diagnostic device can be addressed to monitoring device 1104. As a result, in some cases, the monitoring device 1104 can be inactive (e.g., in sleep or standby mode) until the test signal is received, at which point the monitoring device 1104 becomes active in response to the test signal. When a test signal is received by the monitoring device 1104, the monitoring device 1104 can implement certain procedures (e.g., embedded in the test signals, according to a protocol 632 stored in the storage repository 630) to test (e.g., identify, determine whether the electrical connector 677 is coupled to the reefer receptacle 675) the reefer container (e.g., reefer container 660). For example, the monitoring device 1104 can apply a short across the neutral and A-phase electrical conductors feeding the reefer container. In this way, a reply signal (e.g., the test signal or a variation thereof) is returned to the diagnostic device.

By analyzing the reply signal, the diagnostic device can identify the reefer container and/or determine whether the electrical connector is coupled to the reefer receptacle. For example, the impedance along the path traveled by the test signal and corresponding reply signal can be known or otherwise determined. In such a case, the voltage drop of the reply signal relative to the test signal can be determined and analyzed by the diagnostic device. When multiple phases are involved, the superposition of two phases can used to interpret the reply signal.

Figure 13:
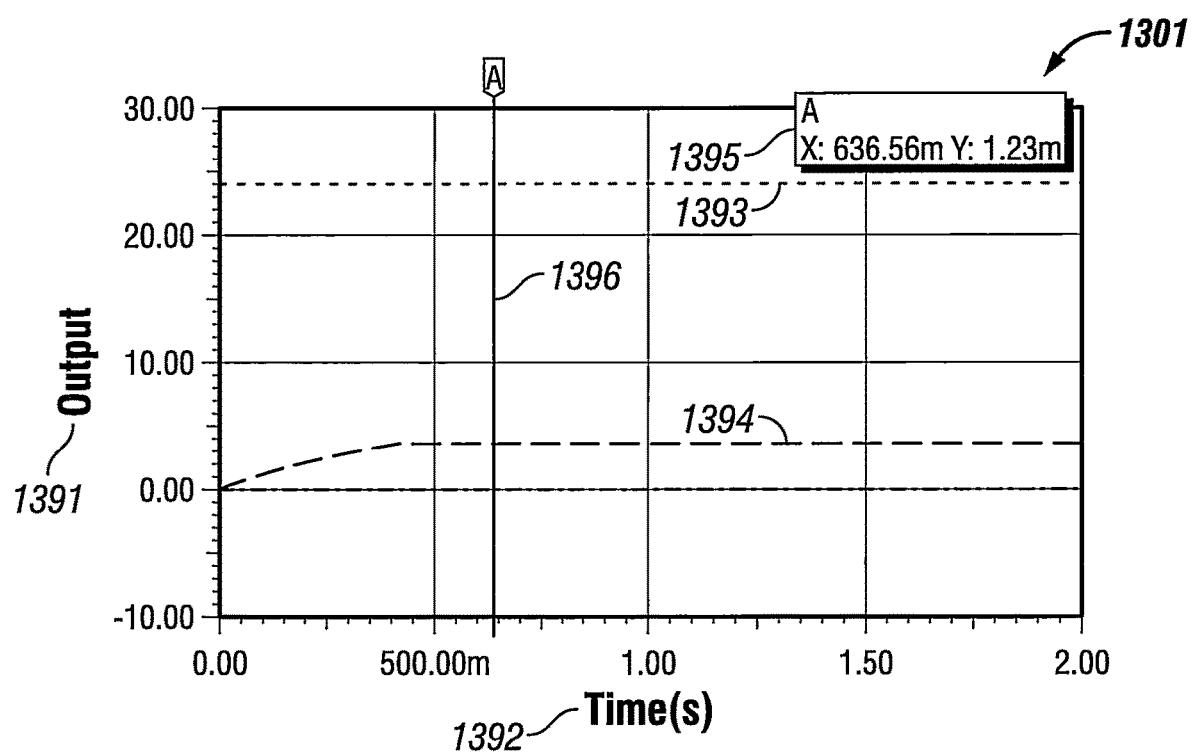
FIGS. 13-15 show graphical examples of how an example monitoring device can be used to identify a reefer container.
Figure 14:
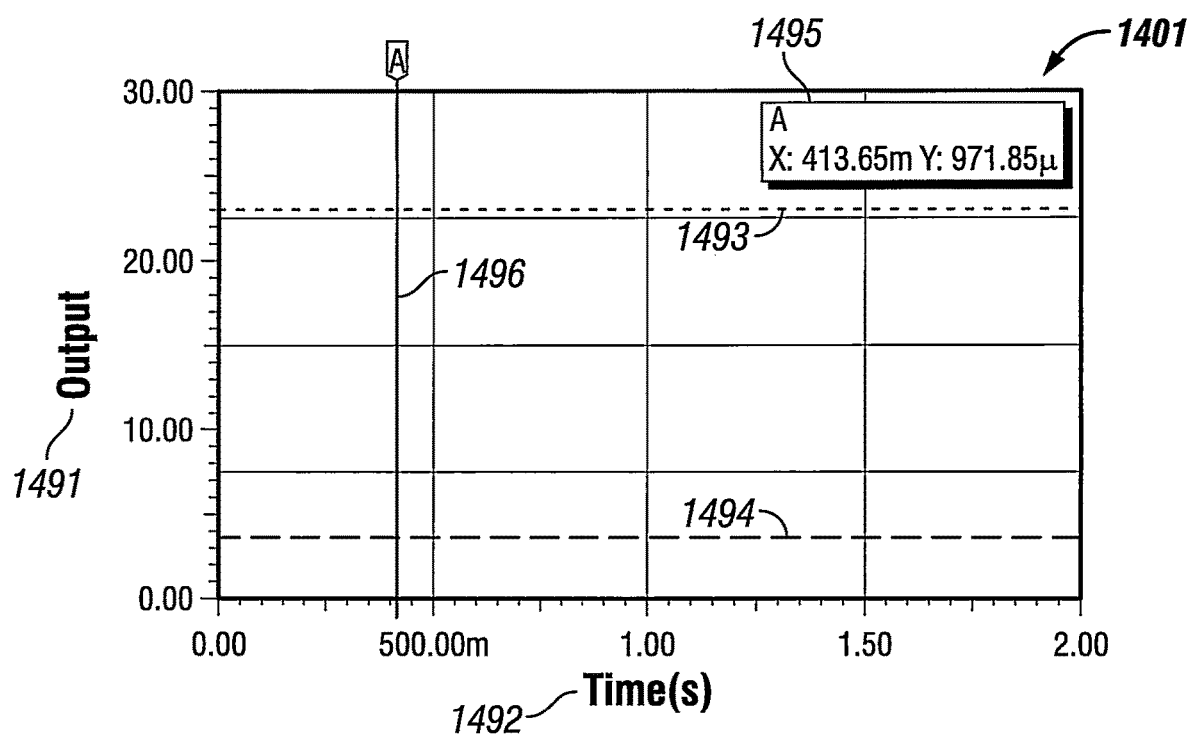
Figure 15:
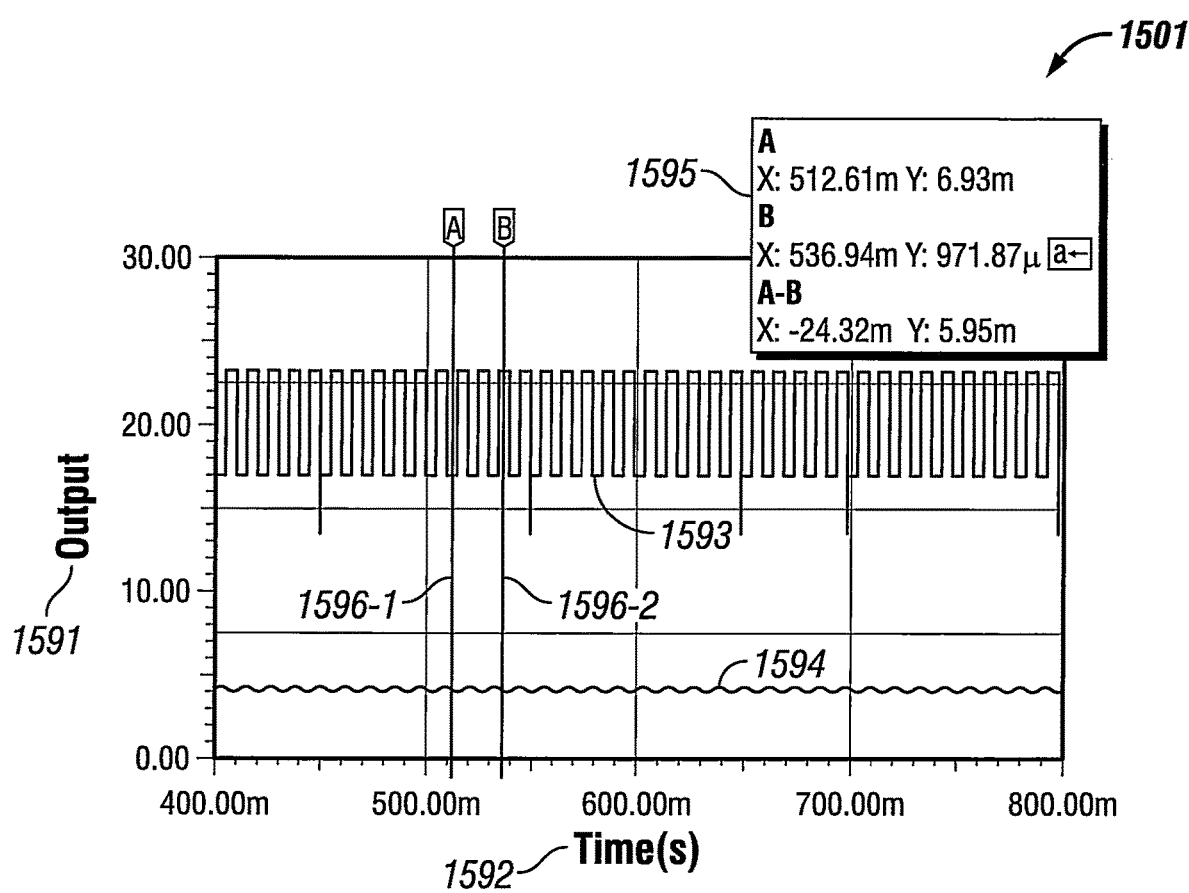

FIGS. 13-15 show graphical examples of how an example monitoring device can be used to inspect an electrical network. Referring to FIGS. 1-15, the graph 1301 of FIG. 13 includes a curve 1394 showing the startup and steady-state current draw of an example monitoring device in standby or sleep mode and while the associated electrical device is in service (e.g., operating on 480 VAC). The graph 1301 nominally plots DC voltage 1391 along the vertical axis against time 1392 along the horizontal axis. The selector 1396 highlights the results in the table 1395, which displays current (part of a secondary horizontal axis, hidden from view) used by the monitoring device at a particular point in time 1392. The current (approximately 1.3 mA) used by the monitoring device while in steady-state sleep mode allows the monitoring device to monitor the input voltage and find an abnormal operating condition (e.g., a missing phase, a dipping voltage level).

The graph 1401 of FIG. 14 is substantially similar to the graph 1301 of FIG. 13, except as described below. Specifically, the graph 1401 of FIG. 14 shows the test signal 1493 (in this case, approximately 24 VDC) as well as the current 1494 (approximately 1 mA, as shown in the table 1495) drawn by the monitoring device. In this case, the associated electrical device is idle (i.e., the 480 VAC operating voltage is removed). The test signal 1493 is generated by the diagnostic device, and the monitoring device is in standby mode.

The graph 1501 of FIG. 15 is substantially similar to the graph 1401 of FIG. 14, except as described below. Specifically, the graph 1501 of FIG. 15 shows the test signal 1593 (varying between approximately 17 VDC and 24 VDC in a square wave pattern) as well as the current 1594 (varying between 1 mA and 7 mA, as shown in the table 1595) drawn by the monitoring device. In this case, the associated electrical device is still idle (i.e., the 480 VAC operating voltage is removed). The test signal 1593 is generated by the diagnostic device, and the monitoring device is in active mode.

By pulsing the test signal 1593, as shown in FIG. 15, data (e.g., instructions, measurements) can be sent to and received between the monitoring device 604 and the diagnostic device 670. Signals sent by the monitoring device 604 to the diagnostic device 670 can be called a return signal or return current herein. The pulsation of the test signal 1593 can be short enough so as not to cause a reset in the monitoring device 604 and/or the diagnostic device 670. The higher draw in current 1594 by the monitoring device 604 can be measured in the return current received by the diagnostic device 670, since the impedance is known. This gives several volts of signal to transfer data from the monitoring device 604 to the diagnostic device 670. The return signal can include one or more of any of a number of different data, including identification of the monitoring device 104, historical data, and fault conditions detected.

Example embodiments can provide for detection of electrical shorts, monitoring of equipment (e.g., breakers) associated with a reefer container, identification of a reefer container, determination of whether a reefer receptacle is providing power to a reefer container (and if so, which specific reefer container 1060 is coupled to which specific reefer receptacle 975), indicate the status of a reefer container, and performing metering functions. In some cases, the reefer containers in which example embodiments are used are located in hazardous (e.g., explosion-proof) environments. As such, example embodiments can be used in environments where one or more applicable industry standards must be met. By using example embodiments, the risk of damage to equipment, risk of loss of goods disposed within a reefer container, and/or risk to personnel safety can be greatly reduced. Also, example embodiments can lead to more efficient storage and loading/unloading of reefer containers for transportation.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An electrical system, comprising:
a diagnostic device that generates a first test signal at a first time;
at least one energy transfer link coupled to the diagnostic device, wherein the first test signal flows through the at least one energy transfer link at the first time;
a portable electrical load coupled to the at least one energy transfer link; and
a monitoring device coupled to the at least one energy transfer link, wherein the monitoring device is disposed between the diagnostic device and the portable electrical load, wherein the monitoring device receives the first test signal, and wherein the monitoring device executes, in response to the first test signal, a test procedure on the portable electrical load, wherein the portable electrical load is portable relative to the diagnostic device, wherein the monitoring device creates a current set point in response to the first test signal.

2. The electrical system of claim 1, wherein the diagnostic device receives a reply signal, wherein the reply signal comprises results of the test procedure on the portable electrical load.

3. The electrical system of claim 2, wherein the reply signal further comprises an identification of the portable electrical load.

4. The electrical system of claim 2, wherein the reply signal further comprises details of the test procedure executed on the portable electrical load.

5. The electrical system of claim 1, wherein the first test signal comprises 24 V direct current.

6. The electrical system of claim 1, wherein the portable electrical load is idle during the first time.

7. The electrical system of claim 6, wherein the diagnostic device prevents the portable electrical load from being put in service when the results of the test procedure on the portable electrical load indicate that the portable electrical load has failed.

8. The electrical system of claim 1, wherein the portable electrical load comprises a refrigeration unit for a reefer container.

9. The electrical system of claim 8, further comprising:
a reefer receptacle that detachably couples to an electrical connector of the reefer container, wherein the diagnostic device is disposed within a housing of the reefer receptacle.

10. The electrical system of claim 1, wherein the monitoring device further receives a second test signal at a second time from the diagnostic device, wherein the monitoring device executes the test procedure on the portable electrical load in response to the second test signal.

11. The electrical system of claim 10, wherein the portable electrical load is in service during the second time.

12. The electrical system of claim 1, wherein the diagnostic device tracks the results of the test procedure executed on the portable electrical load over time to determine whether the portable electrical load is beginning to fail.

13. A reefer container comprising:
an electrical load;
an electrical connector end electrically coupled to the electrical load, wherein the electrical connector end is configured to couple to a reefer receptacle;
at least one electrical conductor coupled to the electrical connector end and the electrical load; and
a monitoring device coupled to the at least one electrical conductor and disposed between the electrical connector end and the electrical load, wherein the monitoring device is configured to receive a test signal from a diagnostic device through the reefer receptacle, the electrical connector end, and the at least one electrical conductor, wherein the monitoring device uses the test signal to conduct a testing procedure on the electrical load in order to determine a condition of the electrical load, wherein the monitoring device creates a current set point in response to the test signal.

14. The reefer container of claim 13, further comprising:
a power module that switches from a low current to a high current when the monitoring engine receives the test signal from the diagnostic device.

15. The reefer container of claim 13, further comprising:
a memory that stores a plurality of instructions; and
a hardware processor that executes the plurality of instructions, wherein the controller determines the test procedure to implement based on the test signal and the plurality of instructions.

16. The reefer container of claim 13, wherein the testing procedure determines an integrity of electrical connection between the electrical connector end and the reefer receptacle.

17. A method for testing an electrical load of a reefer container, the method comprising:
receiving, from a diagnostic device, a test signal;
implementing, in response to the test signal, a test procedure on the electrical load; and
creating a current set point in response to the test signal,
wherein the test signal, while the test procedure is being administered, transforms into a return signal that is sent to the diagnostic device, wherein the return signal comprises the results of the test procedure implemented on the electrical load,
wherein the diagnostic device is configured to determine the condition of the electrical load using the results included in the return signal.

18. The method of claim 17, wherein the electrical load is out of service when the test signal is received.

19. The method of claim 18, wherein the electrical load is put into service when the diagnostic device determines, based on the results of the test procedure, that the electrical load of the reefer container is safe to operate.

* * * * *